United States Patent
Sawada

(10) Patent No.: US 8,810,867 B2
(45) Date of Patent: Aug. 19, 2014

(54) LED MODULE AND IMAGE SENSOR MODULE

(75) Inventor: Hideki Sawada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 287 days.

(21) Appl. No.: 13/471,750

(22) Filed: May 15, 2012

(65) Prior Publication Data

US 2012/0292643 A1 Nov. 22, 2012

(30) Foreign Application Priority Data

| May 19, 2011 | (JP) | 2011-112059 |
| May 19, 2011 | (JP) | 2011-112060 |
| Jun. 15, 2011 | (JP) | 2011-132788 |
| Apr. 10, 2012 | (JP) | 2012-089036 |

(51) Int. Cl.
*H04N 1/04* (2006.01)
*H04N 1/46* (2006.01)
*H01L 27/15* (2006.01)

(52) U.S. Cl.
USPC ............. 358/474; 358/475; 358/510; 257/80

(58) Field of Classification Search
USPC ............. 358/474, 475, 510; 257/80
See application file for complete search history.

(56) References Cited

U.S. PATENT DOCUMENTS

| 7,954,803 B2 | 6/2011 | Kitagawa et al. | |
| 2006/0131591 A1* | 6/2006 | Sumitani | 257/79 |
| 2013/0100508 A1* | 4/2013 | Shimoda | 358/509 |
| 2014/0092444 A1* | 4/2014 | Lee et al. | 358/474 |

FOREIGN PATENT DOCUMENTS

| JP | 2007-300536 | 11/2007 |
| JP | 2008-285259 | 11/2008 |

* cited by examiner

*Primary Examiner* — Firmin Backer
*Assistant Examiner* — Rury Grisham
(74) *Attorney, Agent, or Firm* — Hamre, Schumann, Mueller & Larson, P.C.

(57) ABSTRACT

An LED module includes first through third LED chips and two Zener diodes for preventing excessive voltage application to the first and the second LED chips. A first lead includes a mount portion on which the first through third LED chips and the two Zener diodes are mounted. A resin package covers part of the first lead and includes an opening for exposing the three LED chips and two Zener diodes. A single insulating layer bonds the first and second LED chips to the first lead. A single conductive layer bonds the third LED chip and two Zener diodes to the first lead. The Zener diodes are arranged between the first, second LED chips and the third LED chip.

19 Claims, 27 Drawing Sheets

LED MODULE AND IMAGE SENSOR MODULE

BACKGROUND OF THE INVENTION

1. Field of the Invention

The present invention relates to an image sensor module for use in e.g. a document scanner. The invention also relates to an LED module used for such an image sensor module.

2. Description of the Related Art

FIG. 13 shows an example of a conventional image sensor module. The image sensor module 900 shown in the figure is designed to read the content of a read object 890 transferred in a secondary scanning direction y as image data. The image sensor module 900 includes a case 91, a substrate 92, an LED module 93, a light guide 94, a lens unit 95, a sensor IC 96, and a light-transmitting plate 97. The case 91 is elongated in the primary scanning direction perpendicular to the secondary scanning direction y and the thickness direction z. The substrate 92 is in the form of a rectangle elongated in the primary scanning direction and fitted in the case 91. The LED module 93 includes a plurality of LED chips 93a and arranged at one of the ends of the case 91 which are spaced from each other in the primary scanning direction.

The light guide 94 guides the light emitted from the LED module 93 toward the read object 890 and is made of transparent resin. The light guide 94 is elongated in the primary scanning direction and includes an incident surface (not shown), a reflective surface 94a, and an emission surface 94b. The incident surface is one of the end surfaces of the light guide 94 which are spaced from each other in the primary scanning direction and faces the LED chips 93a. The reflective surface 94a reflects the light traveling from the incident surface. The emission surface 94b is elongated in the primary scanning direction and allows the light traveling through the light guide 94 to be emitted toward the read object 890 as linear light elongated in the primary scanning direction. The light emitted from the light guide 94 becomes incident on the read object 890 through the light-transmitting plate 97 and is reflected by the read object 890. The reflected light is converged onto the sensor IC 96 by the lens unit 95. The sensor IC 96 is configured to output a signal corresponding to the amount of light received. The signals outputted from the sensor IC 96 is stored in a memory (not shown), whereby the content of the read object 890 is read as an image.

To realize size reduction of the image sensor module 900, size reduction of the LED module 93 is necessary. The size of the LED module 93 largely depends on the arrangement of the LED chips 93a. For the LED chips 93a, bonding onto leads (not shown) or connection using a wire is essential. Dense arrangement of the LED chips 93a makes it difficult to arrange bonding layers or wires for the bonding.

When the read object 890 has a fold or a wrinkle, the read object 890 tends to separate from the surface of the light-transmitting plate 97. In such a case, to clearly form an image of the content of the read object 890 onto the sensor IC 96, it is desirable to make the light path extending from the read object 890 to the sensor IC 96 longer. However, when the sensor IC 96 is arranged at a lower position to make the light path longer, the dimension of the image sensor module 900 in the thickness direction z increases, making it difficult to incorporate the image sensor module 900 in e.g. a document scanner.

FIG. 37 shows an example of conventional document scanner (see Patent Document 2, for example.) The document scanner 900 shown in the figure includes image sensor modules 910, 920, a pair of driving rollers 930, a pair of driven rollers 940, and a case 950. The paired driving rollers 930 are spaced apart from each other, with the image sensor module 910 intervening between them. The paired driven rollers 940 are spaced apart from each other, with the image sensor module 920 intervening between them. The read object 890 is transferred between the image sensor modules 910 and 920 while being sandwiched between the driving rollers 930 and the driven rollers 940. In this process, the content described on the lower surface of the read object 890 is read by the image sensor module 910, while the content described on the upper surface of read object 890 is read by the image sensor module 920.

In recent years, there is an increasing demand for size reduction of document scanners. For instance, reduction in dimension of the document scanner 900 in the transfer direction of read object 890 is desired. Further, reduction in dimension in the thickness direction of the read object 890 is also demanded. With the conventional arrangement, however, to avoid contact of the image sensor modules 910, 920 with the driving or driven rollers 930, 940, there is a limit on reduction in dimension of the document scanner 900 in the transfer direction of the read object 890. Further, to make the document scanner 900 thinner, the image sensor modules 910, 920 need to be made thinner.

Patent Document 1: JP-A-2007-300536
Patent Document 2: JP-A-2008-285259

SUMMARY OF THE INVENTION

The present invention has been conceived under the above-described circumstances. It is therefore an object of the present invention to provide an LED module and an image sensor module which realize size reduction.

Variations of the present invention have been conceived under the above-described circumstances and aims to provide an image sensor module which realizes thickness reduction while keeping the mechanical strength.

Variations of the present invention have been conceived under the above-described circumstances and aims to provide a document scanner which realizes size reduction.

According to a first aspect of the present invention, there is provided an LED module comprising a first LED chip and a second LED chip each including a pair of front electrodes provided on a same side, a third LED chip including a front electrode and a back electrode provided on opposite sides, a first and a second. Zener diodes for preventing excessive voltage application to the first and the second LED chips, a first lead including a mount portion on which the first through the third LED chips and the first and the second Zener diodes are mounted, and a resin package covering part of the first lead and including an opening that exposes the first through the third LED chips and the first and the second Zener diodes. The first and the second LED chips are bonded to the first lead via a common insulating layer. The third LED chip and the first and the second Zener diodes are bonded to the first lead via a common conductive layer. The first and the second Zener diodes are arranged between the first and the second LED chips and the third LED chip.

In a preferred embodiment, the conductive layer contains Ag.

In a preferred embodiment, the insulating layer is transparent.

In a preferred embodiment, part of the conductive layer intervenes between the mount portion and part of the insulating layer.

In a preferred embodiment, the conductive layer and the insulating layer are arranged side by side in a second direction perpendicular to the first direction normal to a surface of the mount portion on which the first through the third LED chips and the first and the second Zener diodes are mounted.

In a preferred embodiment, the first LED chip and the second LED chip are arranged side by side in a third direction perpendicular to both of the first direction and the second direction.

In a preferred embodiment, the first Zener diode and the second Zener diode are arranged side by side in the third direction.

In a preferred embodiment, the LED module further comprises a second lead including a wire bonding portion arranged on a first side in the third direction with respect to the mount portion of the first lead, and a third lead including a wire bonding portion arranged on a second side opposite to the first side in the third direction with respect to the mount portion of the first lead. The first LED chip is arranged on the first side in the third direction with respect to the second LED chip, with one of the paired front electrodes connected to the wire bonding portion of the second lead via a wire. The second LED chip is arranged on the second side in the third direction with respect to the first LED chip, with one of the paired front electrodes connected to the wire bonding portion of the third lead via a wire.

In a preferred embodiment, the other one of the paired front electrodes of each of the first LED chip and the second LED chip is connected to the first lead via a wire.

In a preferred embodiment, the first Zener diode includes a front electrode connected to the wire bonding portion of the second lead via a wire, and the second Zener diode includes a front electrode connected to the wire bonding portion of the third lead via a wire.

In a preferred embodiment, the wire bonding portion of the second lead projects toward the mount portion of the first lead in the third direction.

In a preferred embodiment, the wire bonding portion of the third lead projects toward the mount portion of the first lead in the third direction.

In a preferred embodiment, each of the first through the third leads includes a terminal portion extending out the resin package in the third direction from a position deviated from the opening in the second direction.

According to a second aspect of the present invention, there is provided an image sensor module comprising: a light source unit including the LED module provided according to the first aspect of the present invention and a light guide elongated in a primary scanning direction corresponding to the first direction and including an incident surface facing the opening, a reflective surface for reflecting light traveling from the incident surface and an emission surface for emitting light traveling from the reflective surface as linear light elongated in the primary scanning direction; a first mirror including a pair of first end surfaces elongated in the primary scanning direction and a first reflective surface sandwiched between the first end surfaces, the first mirror being configured to reflect the linear light, having been reflected by the read object, at the first reflective surface in a secondary scanning direction corresponding to the second direction; a lens unit for allowing light reflected by the first mirror to pass through; a second mirror including a pair of second end surfaces elongated in the primary scanning direction and a second reflective surface sandwiched between the second end surfaces, the second mirror being configured to reflect the light passing through the lens unit at the second reflective surface in a thickness direction perpendicular to both of the primary scanning direction and the secondary scanning direction; a case integrally formed with the first and the second mirrors; a sensor IC for receiving light reflected by the second mirror; and a substrate on which the sensor IC is mounted and to which the terminal portions of the first through the third leads of the LED module are connected.

In a preferred embodiment, the substrate and at least part of the light guide are arranged so as not to overlap each other in the secondary scanning direction.

In a preferred embodiment, the case includes a pair of first supporting surfaces in contact with the first end surfaces and a pair of second supporting surfaces in contact with the second end surfaces.

In a preferred embodiment, the optical axis of the lens unit crosses the first mirror at a point offset toward the read object in the thickness direction of the first mirror.

In a preferred embodiment, the optical axis of the lens unit crosses the second mirror at a point offset toward the read object in the thickness direction of the second mirror.

In a preferred embodiment, the light guide, the first mirror, the lens unit and the second mirror are arranged side by side in a mentioned order in the secondary scanning direction and overlap each other in the thickness direction.

With the above-described arrangement, neither the insulating layer nor the conductive layer is divided into a plurality of separate portions. This allows the insulating layer and the conductive layer, as well as the first through the third LED chips and the first and the second Zener diodes mounted on the mount portion via these layers, to be arranged densely in a relatively small area. Moreover, by arranging the first and the second Zener diodes adjacent to the first and the second LED chips, the wires extending from these elements are prevented from crossing each other. Thus, the LED module can be made small while avoiding contact between the wires.

Other features and advantages the present invention become clearer from the detailed description given below with reference to the accompanying drawings.

DETAILED DESCRIPTION OF THE PREFERRED EMBODIMENTS

Preferred embodiments of the present invention are described below with reference to the accompanying drawings.

Figure 1:
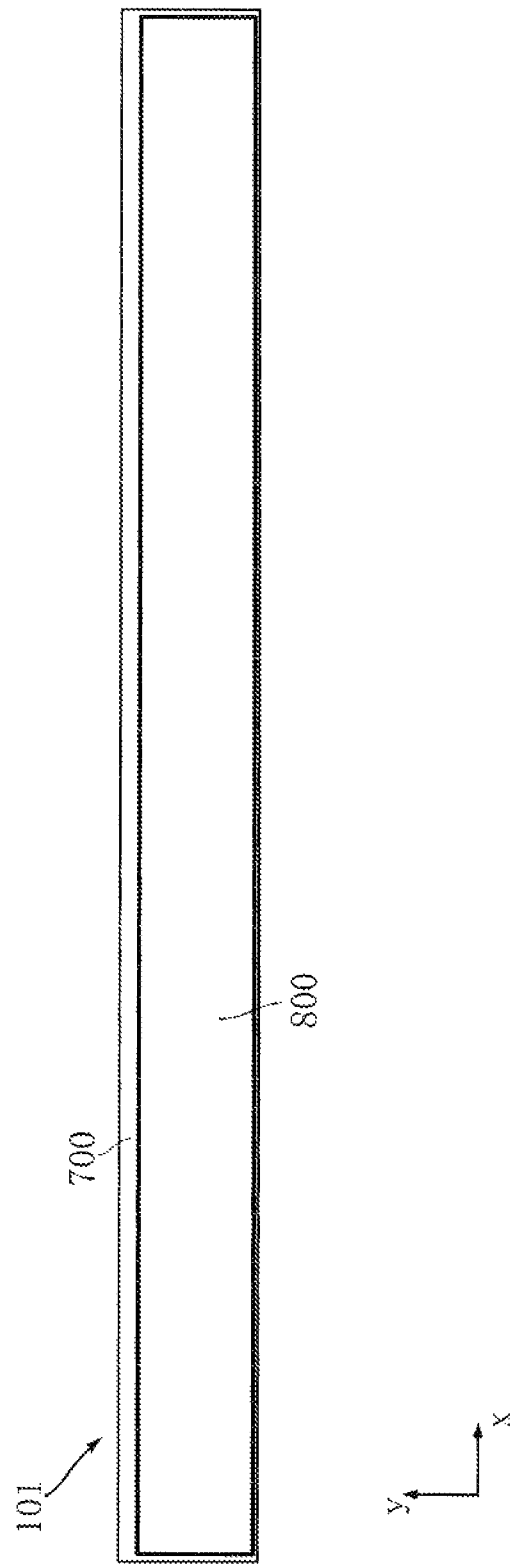
FIG. 1 is a plan view showing an image sensor module according to the present invention.
Figure 2:
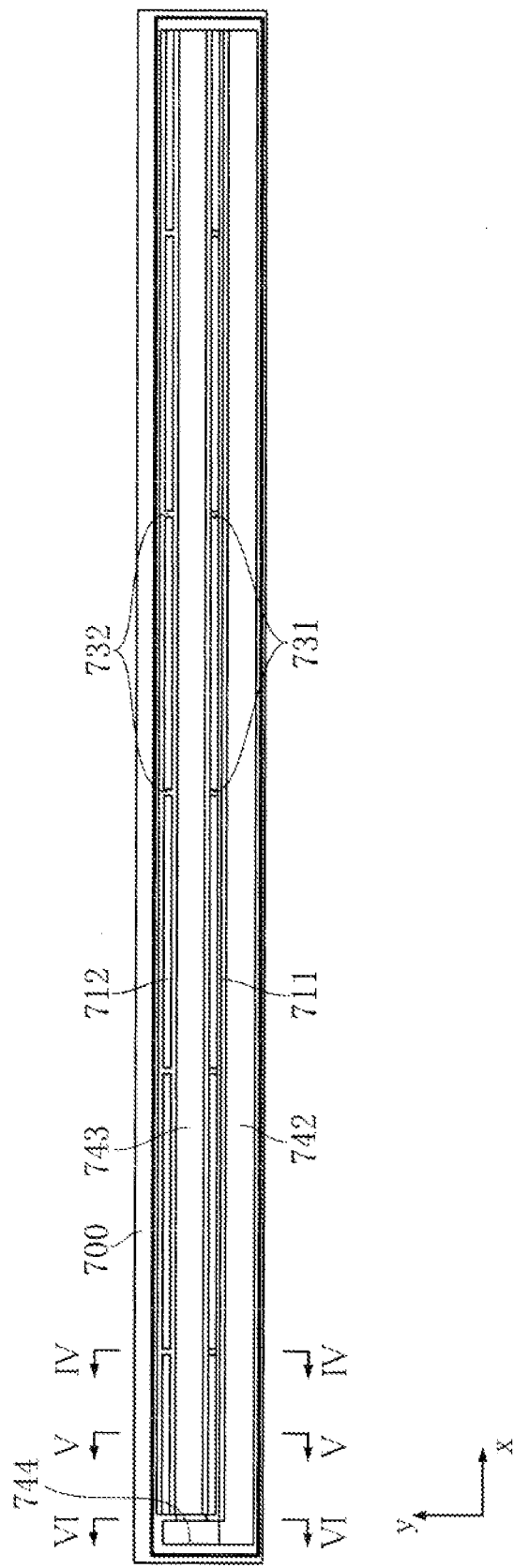
FIG. 2 is a plan view showing a case of the image sensor module of FIG. 1.
Figure 3:
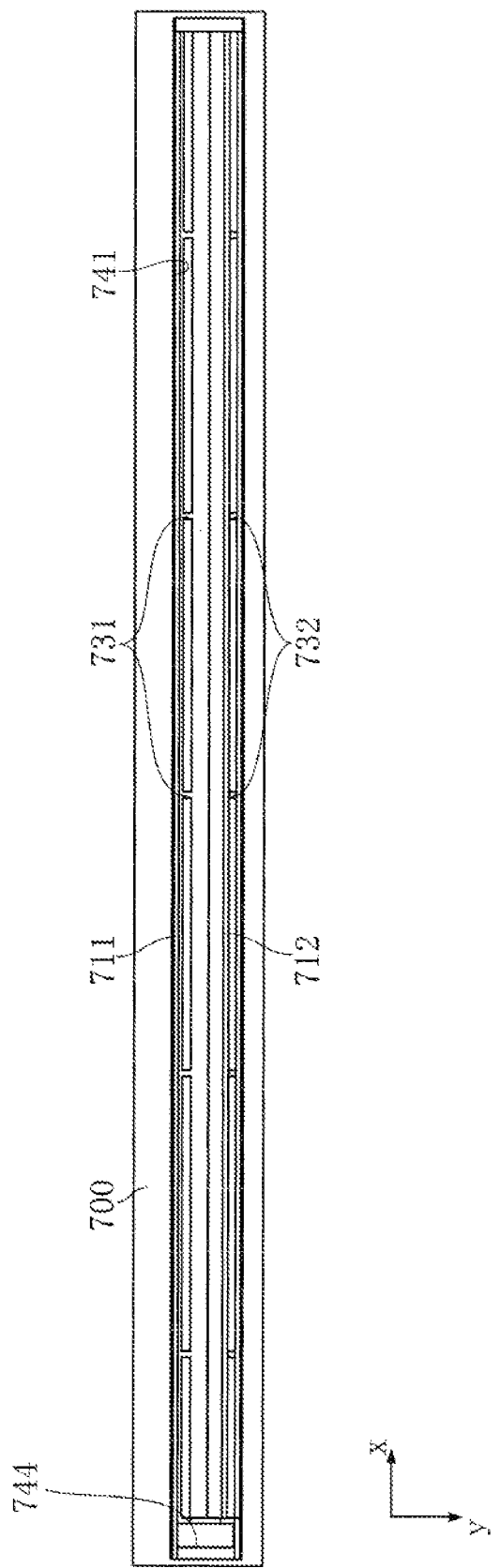
FIG. 3 is a bottom view showing the case of the image sensor module of FIG. 1.
Figure 4:
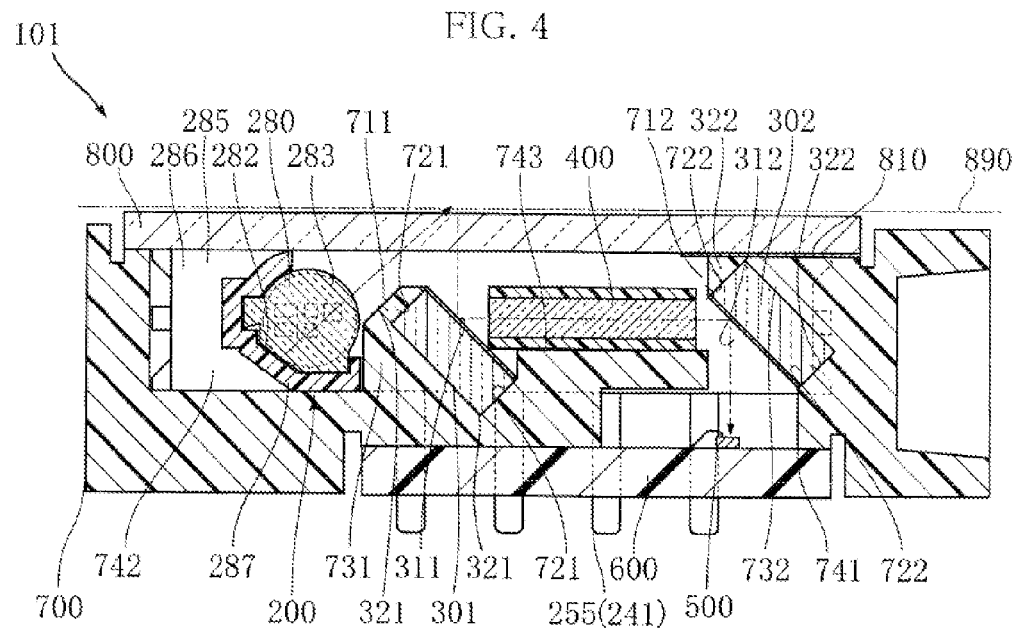
FIG. 4 is sectional view taken along lines IV-IV in FIG. 2.
Figure 5:
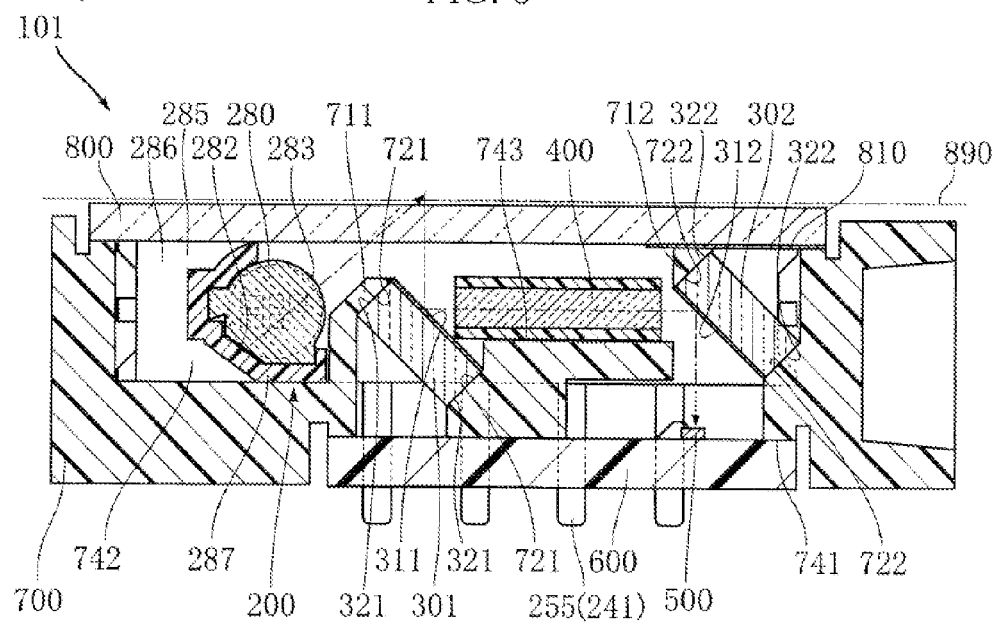
FIG. 5 is a sectional view taken along lines V-V in FIG. 2.
Figure 6:
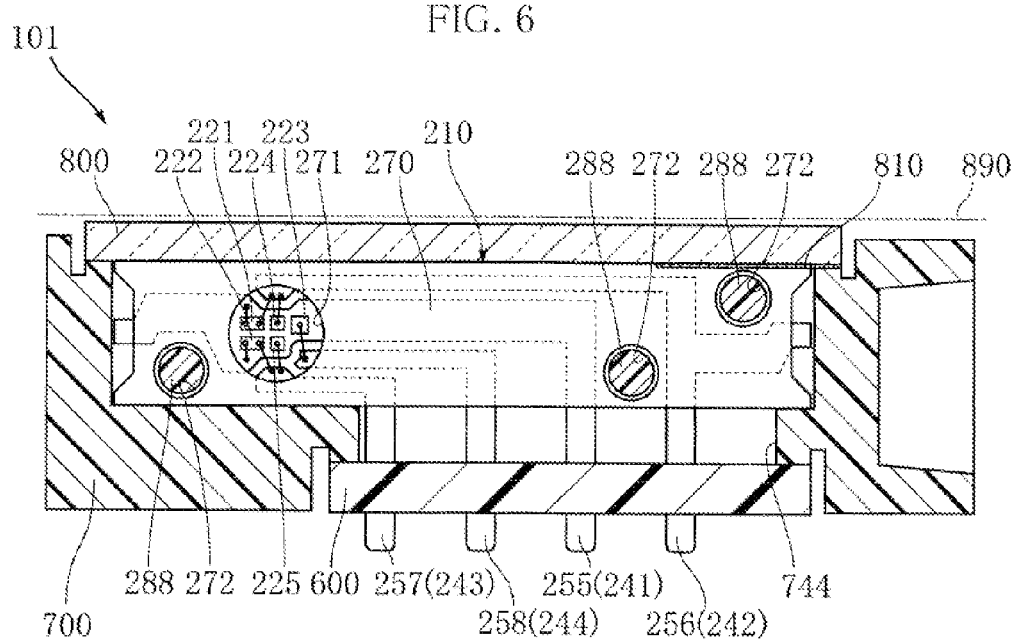
FIG. 6 is a sectional view taken along lines VI-VI in FIG. 2.

FIG. 1 and FIGS. 4-6 show an example of image sensor module according to the present invention. The image sensor module 101 of this embodiment includes a light source unit 200, mirrors 301 and 302, a lens unit 400, a sensor IC 500, a substrate 600, a case 700, and a light-transmitting plate 800. FIGS. 2 and 3 are a plan view and a bottom view, respectively, showing the case 700 only. FIGS. 4-6 are sectional views of the image sensor module 101 taken along different lines indicated in FIG. 2. The image sensor module 101 can be used in e.g. a document scanner, which is configured to optically read letters or images printed on a read object 890 to generate electronic data representing the letters or images.

The case 700 defines the outer configuration of the image sensor module 101 and houses other structural elements. The case 700 is elongated in the primary scanning direction x and is generally rectangular in cross section defined by the secondary scanning direction y and the thickness direction z. Examples of the material for the case 700 include liquid crystal polymer resin.

As shown in FIGS. 2-6, the case 700 includes beams 711, 712, a pair of supporting surfaces 721, a pair of supporting surfaces 722, a plurality of ribs 731, a plurality of ribs 732, a substrate receiving portion 741, a light guide receiving portion 742, a lens unit receiving portion 743, and a terminal-receiving through-hole 744.

As shown in FIGS. 2, 3 and 6, the terminal-receiving through-hole 744 is provided at one of the ends of the case 700 which are spaced from each other in the primary scanning direction x. The terminal-receiving through-hole 744 penetrates the case 700 in the thickness direction z and is rectangular in cross section.

As shown in FIGS. 2, 4 and 5, the light guide receiving portion 742 is elongated in the primary scanning direction x and arranged at a position closer to one of the ends which are spaced from each other in the secondary scanning direction y. The light guide receiving portion 742 is generally rectangular in cross section and opens upward in the thickness direction z.

The beam 711 corresponds to the first beam of the present invention and is elongated in the primary scanning direction x, as shown in FIG. 2. As shown in FIGS. 4-6, the beam 711 is adjacent to the light guide receiving portion 742 in the secondary scanning direction y. In this embodiment, the beam 711 includes a surface facing upward in the thickness direction z, and a pair of inclined surfaces inclined with respect to the secondary scanning direction y and the thickness direction z. The one of the paired inclined surfaces that is on the lower right side in FIGS. 4 and 5 and a surface which faces this inclined surface are the paired supporting surfaces 721. The supporting surfaces 721 correspond to the first supporting surfaces of the present invention.

As shown in FIGS. 2 and 3, the ribs 731 are arranged at equal intervals in the primary scanning direction x. As shown in FIG. 4, each of the ribs 731 is connected to the beam 711, and in contact with the mirror 301 in this embodiment.

The lens unit receiving portion 743 is arranged adjacent to the center of the case 700 in the secondary scanning direction y.

The beam 712 corresponds to the second beam of the present invention and is elongated in the primary scanning direction x, as shown in FIG. 2. As shown in FIGS. 4-6, in the secondary scanning direction y, the beam 712 is on the opposite side of the beam 711 across the lens unit receiving portion 743. In this embodiment, the beam 712 includes a surface facing upward in the thickness direction z, a surface facing to the left in the secondary scanning direction y, and an inclined surface inclined with respect to the secondary scanning direction y and the thickness direction z. Thus, the beam 712 is generally triangular in cross section. The inclined surface of the beam 712 and a surface facing the inclined surface are the paired supporting surfaces 722. The supporting surfaces 722 correspond to the second supporting surfaces of the present invention.

As shown in FIGS. 2 and 3, the ribs 732 are arranged at equal intervals in the primary scanning direction x. As shown in FIG. 4, each of the ribs 732 is connected to the beam 712, and in contact with the mirror 302 in this embodiment.

As shown in FIG. 3, the substrate receiving portion 741 is elongated in the primary scanning direction x, and is open downward in the thickness direction z, as shown in FIGS. 4-6.

The substrate 600 comprises an insulating member made of e.g. a ceramic material or a glass-fiber-reinforced epoxy resin, and a wiring pattern (not shown) formed on the insulating member. The substrate 600 is in the form of a rectangle elongated in the primary scanning direction x. The substrate 600 is housed in the substrate receiving portion 741 of the case 700 and fixed to the case 700 with e.g. an adhesive. As shown in FIGS. 4 and 5, on the substrate 600 is mounted the sensor IC 500.

The light-transmitting plate 800 is a plate member made of a transparent material such as glass and attached to cover the upper side of the case 700 in the thickness direction z.

The light source unit 200 is a unit for emitting linear light necessary for image reading by the image sensor module 101 and includes an LED module 210, a light guide 280 and a reflector 285.

Figure 7:
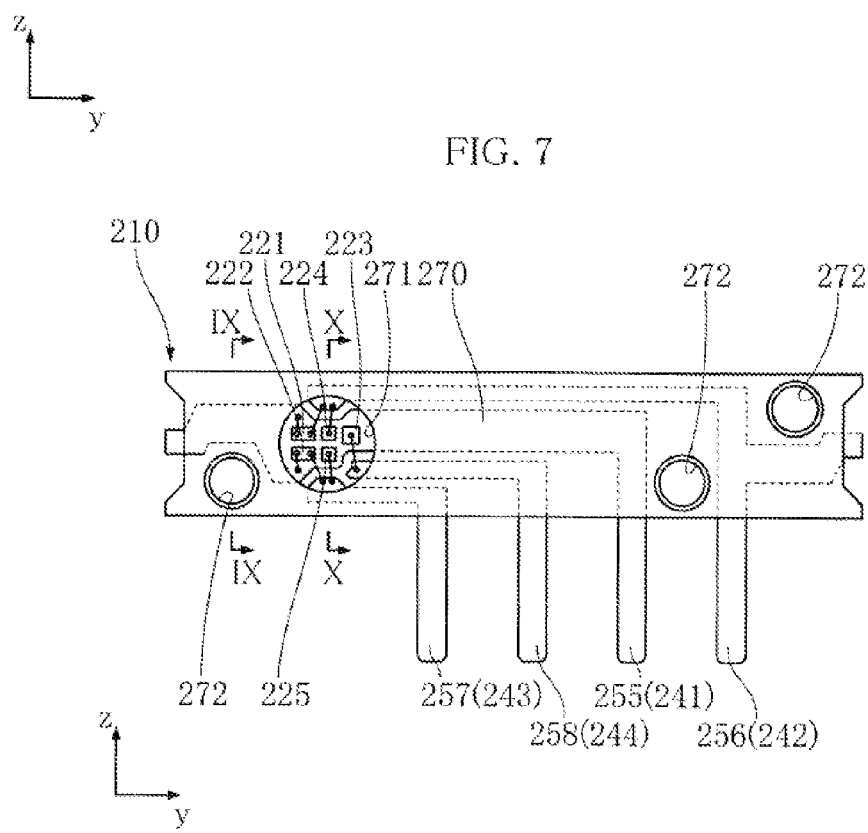
FIG. 7 is a front view showing an LED module of a light source unit of the image sensor module of FIG. 1.
Figure 8:
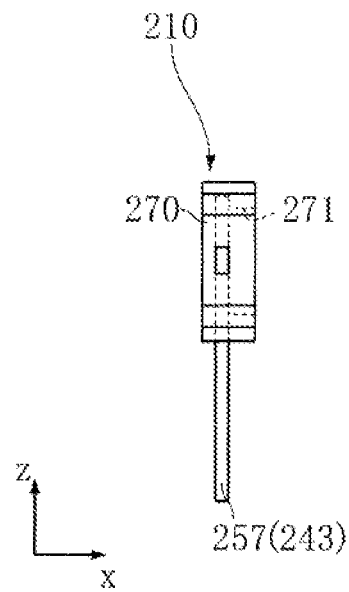
FIG. 8 is a side view of the LED module of the light source unit of the image sensor module of FIG. 1.

The LED module 210 is an example of the LED module according to the present invention. The LED module 210 achieves the light emitting function of the light source unit 200. As shown in FIGS. 7 and 8, the LED module 210 includes LED chips 221, 222, 223, Zener diodes 229, 225, leads 241, 242, 243, 244 and a resin package 270.

The resin package 270 is made of a white resin such as liquid crystal polymer resin or an epoxy resin and covers part of each lead 241, 242, 243, and 244. The resin package 270 includes an opening 271 and a plurality of positioning holes 272. The opening 271 is provided adjacent to one of the ends of the resin package 270 which are spaced from each other in the secondary scanning direction y and is circular in cross section. The positioning holes 272 are provided at positions avoiding the leads 241, 242, 243, 244 and penetrate the resin package 270 in this embodiment.

Figure 11:
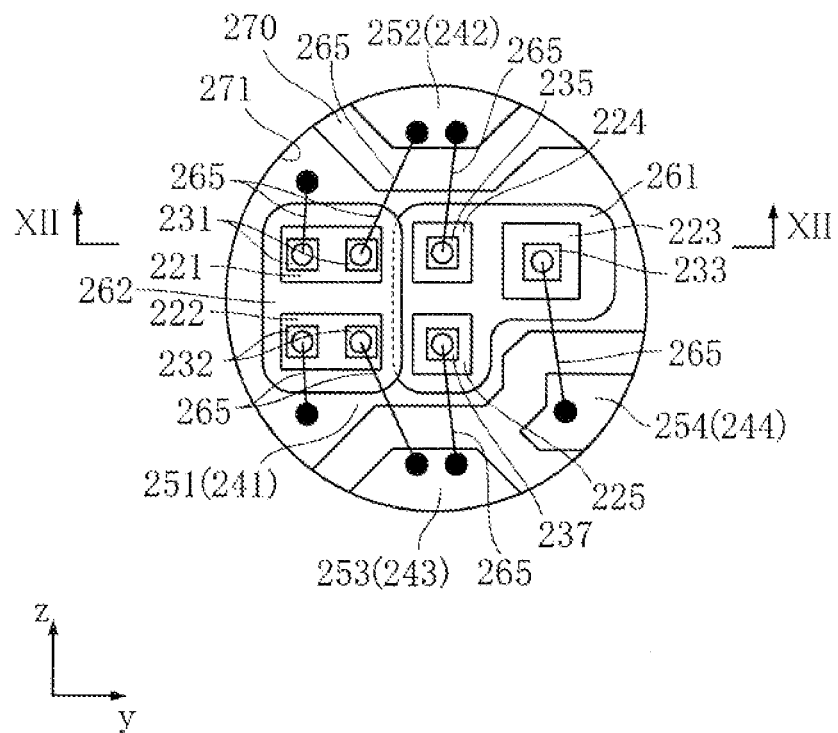
FIG. 11 is an enlarged front view schematically showing the opening of the LED module of FIG. 7.

The lead 241 corresponds to the first lead of the present invention, and includes a mount portion 251 and a terminal portion 255, as shown in FIGS. 7 and 11. The lead 241 includes a portion elongated in the secondary scanning direction y and a portion elongated in the thickness direction z. The mount portion 251 is provided adjacent to the left end in the figure of the portion elongated in the secondary scanning direction y. On the mount portion 251, the LED chips 221, 222, 223 and the Zener diodes 224, 225 are mounted. In this embodiment, the mount portion 251 is partially narrowed in the thickness direction z as compared with adjacent portions of the lead 241. The mount portion 251 is exposed through the opening 271 of the resin package 270. The terminal portion 255 projects downward from the resin package 270 in the thickness direction z and is connected to the substrate 600.

The lead 242 corresponds to the second lead of the present invention and includes a wire bonding portion 252 and a terminal portion 256. The lead 242 includes a portion elongated in the secondary scanning direction y and a portion elongated in the thickness direction z. The wire bonding portion 252 is provided adjacent to the left end in the figure of the portion elongated in the secondary scanning direction y. In this embodiment, the wire bonding portion 252 projects downward in the thickness direction z toward the mount portion 251 of the lead 241. The wire bonding portion 252 is exposed through the opening 271 of the resin package 270. The terminal portion 256 projects downward from the resin package 270 in the thickness direction z and is connected to the substrate 600.

The lead 243 corresponds to the third lead of the present invention and includes a wire bonding portion 253 and a terminal portion 257. The lead 243 includes a portion elongated in the secondary scanning direction y and a portion elongated in the thickness direction z. The wire bonding portion 253 is provided adjacent to the left end in the figure of the portion elongated in the secondary scanning direction y. In this embodiment, the wire bonding portion 253 projects upward in the thickness direction z toward the mount portion 251 of the lead 241. The wire bonding portion 253 is exposed through the opening 271 of the resin package 270. The terminal portion 257 projects downward from the resin package 270 in the thickness direction z and is connected to the substrate 600.

The lead 244 includes a wire bonding portion 254 and a terminal portion 258. The lead 244 includes a portion elongated in the secondary scanning direction y and a portion elongated in the thickness direction z. The wire bonding portion 254 is provided adjacent to the left end in the figure of the portion elongated in the secondary scanning direction y. In this embodiment, the wire bonding portion 254 is positioned at the lower right in the figure of the mount portion 251 and on the right side in the figure of the wire bonding portion 253. The wire bonding portion 254 is exposed through the opening 271 of the resin package 270. The terminal portion 258 projects downward from the resin package 270 in the thickness direction z and is connected to the substrate 600.

Figure 12:
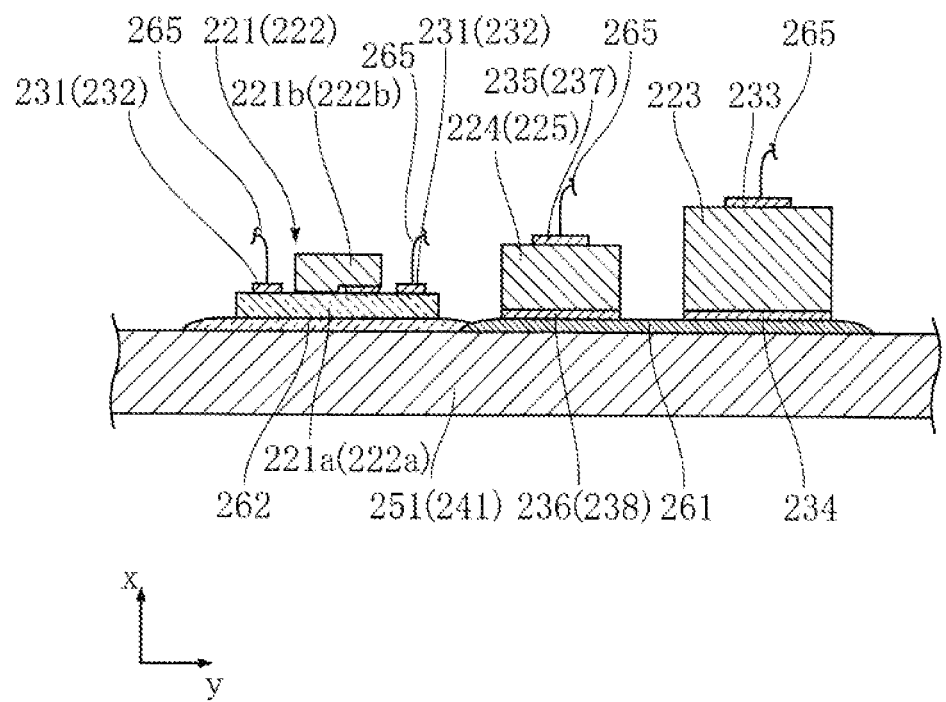
FIG. 12 is a schematic sectional view taken along lines XII-XII in FIG. 11.
Figure 13:
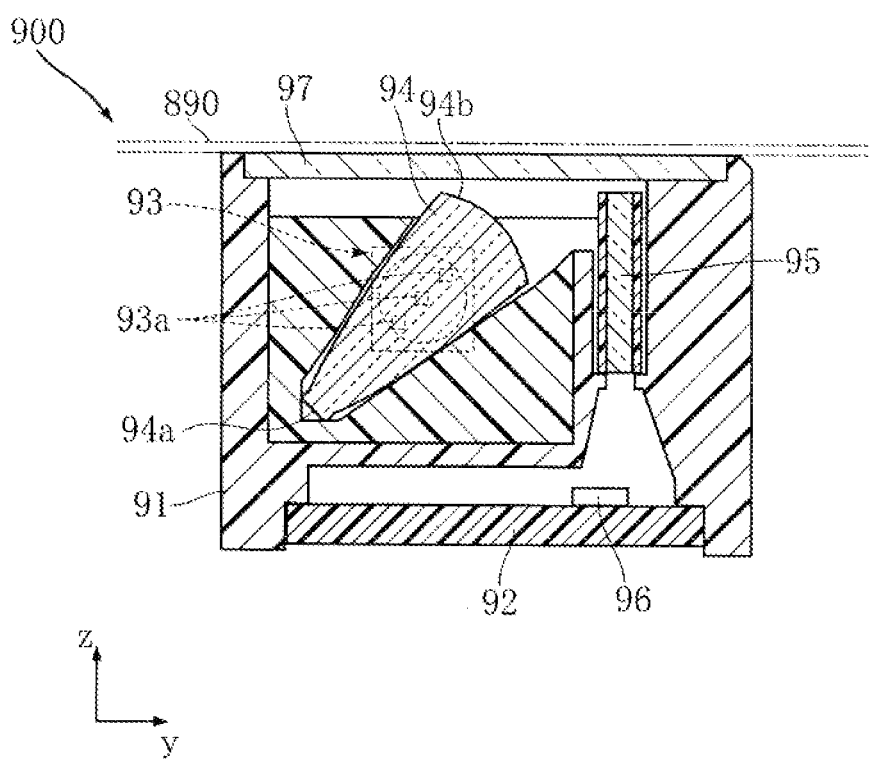
FIG. 13 is a schematic front view of a conventional image sensor module.

The LED chip 221 corresponds to the first LED chip of the present invention. In this embodiment, the LED chip 221 emits green light. As shown in FIG. 11 or 12, the LED chip 221 includes a submount substrate 221a, a semiconductor layer 221b, and a pair of front electrodes 231. The submount substrate 221a is made of e.g. Si and transparent. The semiconductor layer 221b is made of e.g. GaN-based semiconductor, and includes an n-type semiconductor layer, a p-type semiconductor layer and an active layer sandwiched between the n-type semiconductor layer and the p-type semiconductor layer (none shown). The front electrodes 231 are provided on the submount substrate 221a and electrically connected to the n-type semiconductor layer and the p-type semiconductor layer.

The LED chip 222 corresponds to the second LED chip of the present invention. In this embodiment, the LED chip 222 emits blue light. For easier understanding, the references signs indicating the structural elements of the LED chip 222 corresponding to those of the LED chip 221 are shown in parentheses in FIG. 12. The LED chip 222 includes a submount substrate 222a, a semiconductor layer 222b, and a pair of front electrodes 232. The submount substrate 222a is made of e.g. Si and transparent. The semiconductor layer 222b is made of e.g. GaN-based semiconductor material, and includes an n-type semiconductor layer, a p-type semiconductor layer and an active layer sandwiched between the n-type semiconductor layer and the p-type semiconductor layer (none shown). The front electrodes 232 are provided on the submount substrate 222a and electrically connected to the n-type semiconductor layer and the p-type semiconductor layer.

The LED chip 223 corresponds to the third LED chip of the present invention and emits red light in this embodiment. As shown in FIG. 11 or 12, the LED chip 223 includes a semiconductor layer made of e.g. GaAs-based semiconductor material, a front electrode 233 and a back electrode 234. The semiconductor layer includes an n-type semiconductor layer, a p-type semiconductor layer and an active layer sandwiched between the n-type semiconductor layer and the p-type semiconductor layer (none shown). The front electrode 233 is provided on the upper side of the LED chip 223 in the thickness direction z. The back electrode 234 is provided on the lower side of the LED chip 223 in the thickness direction z.

The Zener diode 224 corresponds to the first Zener diode of the present invention and serves to prevent excessive voltage application to the LED chip 221. The Zener diode 224 includes a front electrode 235 and a back electrode 236. The Zener diode 225 corresponds to the second Zener diode of the present invention and serves to prevent excessive voltage application to the LED chip 222. The Zener diode 225 includes a front electrode 237 and a back electrode 238.

The LED chips 221 and 222 are spaced from each other in the thickness direction z and mounted on the mount portion 251 of the lead 241 via an insulating layer 262. In this embodiment, the insulating layer 262 is transparent and made of e.g. a transparent resin. The Zener diodes 224 and 225 are spaced from each other in the thickness direction z and positioned on the right side of the LED chips 221 and 222 in the secondary scanning direction y. The LED chip 223 is arranged on the opposite side of the LED chips 221 and 222 across the Zener diodes 224 and 225 in the secondary scanning direction y. The LED chip 223 and the Zener diodes 224, 225 are mounted on the mount portion 251 of the lead 241 via a conductive layer 261. Specifically, the back electrode 234 of the LED chip 223 and the back electrodes 236, 238 of the Zener diodes 224, 225 are electrically connected to the lead 241 via the conductive layer 261. The conductive layer 261 is made of e.g. Ag.

The mounting process of the LED chips 221, 222, 223 and Zener diodes 224, 225 is performed as follows. First, conductive paste as the material for the conductive layer 261 is applied to the mount portion 251 of the lead 241. Then, the LED chip 223 and the Zener diodes 224, 225 are bonded. Then, the conductive paste is hardened by e.g. baking, whereby the conductive layer 261 is obtained. Then, resin paste as the material for the insulating layer 262 is applied to the mount portion 251. Then, the LED chips 221 and 222 are bonded. Then, the resin paste is hardened, whereby the insulating layer 262 is obtained.

In the above-described process, the insulating layer 262 is formed after the conductive layer 261 is formed. Thus, in the case where the application area of the conductive paste and the application area of the resin paste overlap each other, the conductive layer 261 intervenes between part of the insulating layer 262 and the mount portion 251 of the lead 241. Shown in FIGS. 11 and 12 are the conductive layer 261 and the insulating layer 262 in this state. Depending on the application areas, the conductive layer 261 and the insulating layer 262 may not overlap each other. However, it is to be noted that, according to the above-described process, the insulating layer 262 never intervenes between the conductive layer 261 and the mount portion 251 of the lead 241.

One of the paired front electrodes 231 of the LED chip 221 is connected to the mount portion 251 of the lead 241 with a wire 265, whereas the other of the front electrodes 231 is connected to the wire bonding portion 252 of the lead 242 with a wire 265. One of the paired front electrodes 232 of the LED chip 222 is connected to the mount portion 251 of the lead 241 with a wire 265, whereas the other of the front electrodes 232 is connected to the wire bonding portion 253 of the lead 243 with a wire 265.

The front electrode 233 of the LED chip 223 is connected to the wire bonding portion 254 of the lead 244 with a wire 265. The front electrode 235 of the Zener diode 224 is connected to the wire bonding portion 252 of the lead 242 with a wire 265. The front electrode 237 of the Zener diode 225 is connected to the wire bonding portion 253 of the lead 243 with a wire 265.

Figure 10:
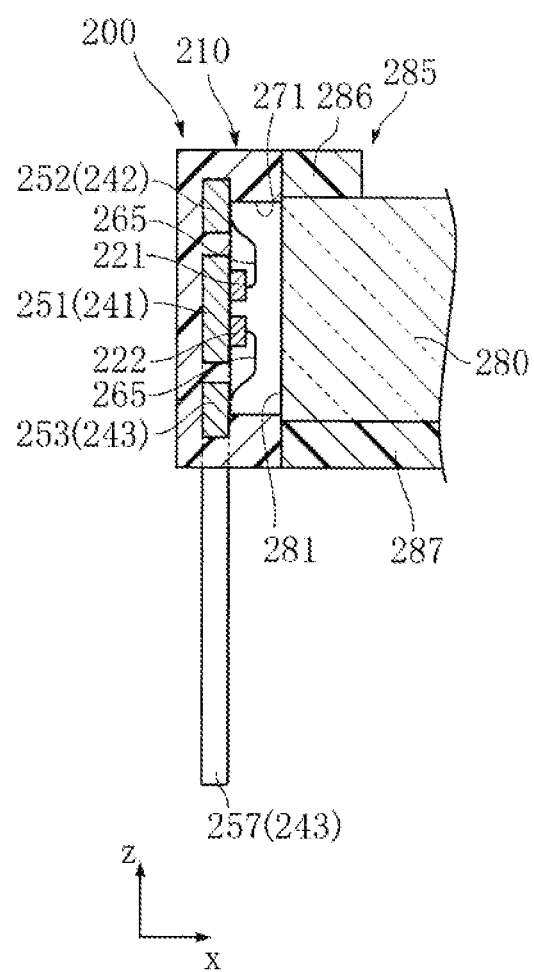
FIG. 10 is a sectional view of the light source unit taken along lines X-X in FIG. 7.

The light guide 280 is provided for converting the light emitted from the LED module 210 into linear light elongated in the primary scanning direction x and made of a transparent acrylic resin such as PMMA (polymethyl methacrylate). The light guide 280 has a generally columnar shape elongated in the primary scanning direction x, and includes an incident surface 281, a reflective surface 282 and an emission surface 283, as shown in FIGS. 4, 5 and 10.

The incident surface 281 is one of the end surfaces of the light guide 280 which are spaced from each other in the primary scanning direction x. The incident surface 281 covers the opening 271 of the resin package 270 of the LED module 210 and faces the LED chips 221, 222 and 223. The reflective surface 282 is a surface elongated in the primary scanning direction x and formed at the lower left portion of the light guide 280 in FIGS. 4 and 5. The reflective surface 282 reflects the light traveling within the light guide 280 after entering through the incident surface 281. For instance, the reflective surface 282 may be a surface with minute irregularities or a surface to which white paint is applied. The emission surface 283 is a surface elongated in the primary scanning direction x and arcuate in cross section in this embodiment. The light reflected at the reflective surface 282 is emitted from the emission surface 283 as linear light elongated in the primary scanning direction x.

Figure 9:
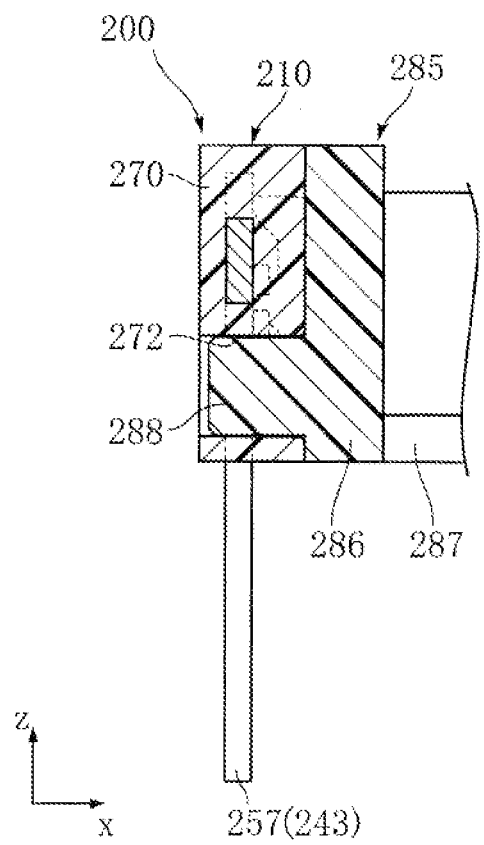
FIG. 9 is a sectional view of the light source unit taken along lines IX-IX in FIG. 7.

The reflector 285 functions to position the light guide 280 relative to the LED module 210 and prevents unfavorable leaking of light from the light guide 280. The reflector 285 is made of e.g. white resin. The reflector 285 includes a base portion 286 and a semicylindrical portion 287. The base portion 286 is in the form of a rectangular plate similar in size and shape to the resin package 270 of the LED module 210 as viewed in the primary scanning direction x. The base portion 286 is provided with a plurality of projections 288. As shown in FIG. 9, each of the projections 288 is fitted in a respective one of the positioning holes 272 of the resin package 270 of the LED module 210. With this arrangement, the reflector 285 is positioned relative to the LED module 210.

The semicylindrical portion 287 is elongated in the primary scanning direction x, and holds in it the light guide 280, as shown in FIGS. 4 and 5. Of the reflector 285, the portion facing the reflective surface 282 of the light guide 280 functions to return the light exiting the light guide 280 through the reflective surface 282 into the light guide 280. By holding the light guide 280 in the semicylindrical portion 287, the light guide 280 is fixed to the reflector 285. Accordingly, the light guide 280 is positioned relative to the LED module 210, along with the reflector 285.

The LED chips 221, 222, 223 and the light guide 280 are arranged at a position deviated to the left from the terminal portions 255, 256, 257, 258 in the secondary scanning direction y. The substrate 600 has a dimension in the secondary scanning direction y just enough for connection to the terminal portions 255, 256, 257, 258 and does not have any extra space. The LED chips 221, 222, 223 and the light guide 280 are arranged at a position deviated to the left from the substrate 600 in the secondary scanning direction y. In this embodiment, the light guide 280 and the substrate 600 do not overlap at all in the secondary scanning direction y. However, the present invention is not limited to this, and the light guide 280 and the substrate 600 may partially overlap in the secondary scanning direction y.

The mirror 301 corresponds to the first mirror of the present invention. The mirror 301 is elongated in the primary scanning direction x. The mirror 301 has a reflective surface 311 and a pair of end surfaces 321. The reflective surface 311 corresponds to the first reflective surface of the present invention. The light emitted from the light source unit 200 and then reflected at the read object 890 is reflected at the reflective surface 311 in the secondary scanning direction y. In this embodiment, the reflective surface 311 is inclined 45° with respect to the secondary scanning direction y and the thickness direction z. The paired end surfaces 321 correspond to a pair of first end surfaces of the present invention and are oriented in opposite directions, with the reflective surface 311 intervening between them. The end surfaces 321 are elongated in the primary scanning direction x and parallel to each other. The end surfaces 321 are in contact with the supporting surfaces 721 of the case 700. The surface of the mirror 301 which is opposite to the reflective surface 311 is in contact with the ribs 731.

The light traveling in the secondary scanning direction y after being reflected at the reflective surface 311 of the mirror 301 passes through the lens unit 400. The lens unit 400 is made up of a plurality of rod lenses and a case made of e.g. resin and accommodating the rod lenses. The rod lenses are configured to form an erecting equal-magnification image of the content of the read object 890 onto the sensor IC 500. The optical axis of the rod lenses extends in the secondary scanning direction y and perpendicularly to the primary scanning direction x.

The mirror 302 corresponds to the second mirror of the present invention. The mirror 302 is elongated in the primary scanning direction x. The mirror 302 has a reflective surface 312 and a pair of end surfaces 322. The reflective surface 312 corresponds to the second reflective surface of the present invention. The light passing through the lens unit 400 is reflected at the reflective surface 312 in the thickness direction z. In this embodiment, the reflective surface 312 is inclined 45° with respect to the secondary scanning direction y and the thickness direction z. The paired end surfaces 322 correspond to a pair of second end surfaces of the present invention and are oriented in opposite directions, with the reflective surface 312 intervening between them. The end surfaces 322 are elongated in the primary scanning direction x and parallel to each other. The end surfaces 322 are in contact with the supporting surfaces 722 of the case 700. The surface of the mirror 302 which is opposite to the reflective surface 312 is in contact with the ribs 732.

The optical axis of the lens unit 400, which extends in the secondary scanning direction y, crosses the reflective surfaces 311, 312 of the mirrors 301, 302. The crossing point of the optical axis of the lens unit 400 and the reflective surface 311 of the mirror 301 is positioned higher than the center of the reflective surface 311 in the thickness direction z. The crossing point of the optical axis of the lens unit 400 and the reflective surface 312 of the mirror 302 is positioned higher than the center of the reflective surface 312 in the thickness direction z.

The case 700 is made by using a resin material such that the mirrors 301, 302 become integral with the case. As shown in FIG. 5, at positions along the primary scanning direction x where the ribs 731, 732 are not provided, the reflective surface 311 and the opposite surface of the mirror 301, as well as the reflective surface 312 and the opposite surface of the mirror 302, are exposed in the thickness direction z. To make the case 700, the mirrors 301 and 302 are held by a jig from above and below in the thickness direction z. After the mirrors 301 and 302, along with the jig, are placed in a mold, a resin material is injected into the mold and then hardened. By this process, the case 700 integrally formed with the mirrors 301, 302 is obtained.

The sensor IC 500 is an element having a photoelectric conversion function to convert received light into electric signals, and mounted on the substrate 600. The sensor IC 500 includes a plurality of light-receiving surfaces (not shown) arranged in a row extending in the primary scanning direction x. The light reflected at the read object 890 is converged by the lens unit 400 onto the light-receiving surfaces.

The light-transmitting plate 800 is provided with a light-shielding film 810. The light-shielding film 810 is an example of light shield of the present invention and formed by applying black paint or attaching a black resin tape to part of the lower surface of the light-transmitting plate 800. The light-shielding film 810 is elongated in the primary scanning direction x, and overlaps the entirety of the mirror 302 and the right end of the lens unit 400 in the secondary scanning direction y.

The advantages of the LED module 210 and the image sensor module 101 are described below.

According to this embodiment, the LED chips 221 and 222 are mounted on the mount portion 251 via the same insulating layer 262, whereas the LED chip 223 and the Zener diodes 224, 225 are mounted on the mount portion 251 via the same conductive layer 261. Neither the insulating layer 262 nor the conductive layer 261 is divided into a plurality of separate portions. This allows the insulating layer 262 and the conductive layer 261, as well as the LED chips 221, 222, 223 and the Zener diodes 224, 225 mounted on the mount portion 251 via these layers, to be arranged densely in a relatively small area. Moreover, by arranging the Zener diodes 224 and 225 adjacent to the LED chips 221 and 222, the wires 265 extending from these elements are prevented from crossing each other. Thus, the LED module 210 can be made small while avoiding contact between the wires 265.

The existence of the conductive layer 261 containing Ag reduces the resistance between the LED chip 223 and the lead 241. The insulating layer 262 which is made transparent allows the light emitted downward from the LED chips 221, 222 to pass through the insulating layer 262 and to be reflected at the lead 241. This enhances the brightness of the LED module 210.

Since the bonding of the LED chips 221, 222 using the insulating layer 262 is performed after the bonding of the Zener diodes 224, 225 and the LED chip 223 using the conductive layer 261, the insulating layer 262 cannot intervene between the conductive layer 261 and the lead 241. Since the intervention of the insulating layer 262 increases the resistance between the conductive layer 261 and the lead 241, to avoid the intervention contributes to reduction of the resistance. The intervention of the conductive layer 261 between the insulating layer 262 and the lead 241 like this embodiment does not cause an increase in the resistance.

Since the wire bonding portions 252 and 253 project toward the mount portion 251, bonding of the wires 265 can be performed easily. The wire bonding portions 252 and 253 projecting in this way can also be used as a positioning mark in positioning the LED chips 221, 222, 223 and the Zener diodes 224, 225 by image analysis in the bonding operation.

As shown in FIGS. 4 and 5, the light path extending from the read object 890 is bent before reaching the sensor IC 500 and is parallel to the secondary scanning direction y in passing through the lens unit 400. With this arrangement, the light path is made relatively long without increasing the dimension of the image sensor module 101 in the thickness direction z. Since the mirrors 301, 302 are formed integrally on the case 700, the mechanical strength of the case 700 is enhanced by the mirrors 301, 302. Thus, the image sensor module 101 can be reduced in dimension in the thickness direction z without reducing the mechanical strength of the case 700.

The mirror 301 is reliably fixed to the case 700 by holding the paired end surfaces 321 of the mirror 301 by the paired supporting surfaces 721 of the case 700. Similarly, the mirror 302 is reliably fixed to the case 700 by holding the paired end surfaces 322 of the mirror 302 by the paired supporting surfaces 722 of the case 700. Since the beams 711 and 712 are elongated in the primary scanning direction x, the mirrors 301 and 302 are held throughout the entire length. The ribs 731 and 732 prevent the beams 711 and 712 from being unfavorably warped. Since the ribs 731, 732 are spaced from each other in the primary scanning direction x, in molding the case 700, the mirrors 301 and 302 can be properly fixed at positions where the ribs 731, 732 are not provided, as shown in FIG. 5.

As noted before, the crossing point of the optical axis of the lens unit 400 and the reflective surface 311, 312 of the mirror 301, 302 is positioned higher than the center of the reflective surface 311, 312 in the thickness direction z. That is to say, the lens unit 400 is arranged at a relatively high position in the thickness direction z relative to the mirrors 301, 302. With this arrangement, large space for the sensor IC 500 is secured below the mirror 302 and the lens unit 400 in the thickness direction z. Generally, connection between the sensor IC 500 and the substrate 600 requires a plurality of wires. The large space is helpful to prevent unfavorable contact between the wires and the case 700. The lens unit 400 is arranged at a relatively high position in the thickness direction z, while the mirrors 301 and 302 are arranged adjacent to the center of the case 700 in the thickness direction z. The mirrors 301 and 302 serve to increase the mechanical strength of the case 700, and arrangement of the mirrors 301 and 302 closer to the center of the case 700 is more favorable for the enhancement of the mechanical strength of the case 700.

The arrangement of the light guide 280, the mirror 301, the lens unit 400, and the mirror 302 side by side in the secondary scanning direction y is favorable for thickness reduction of the image sensor module 101. As noted before, the width of the substrate 600 is set such that the substrate does not overlap the light guide 280 or the LED chips 221, 222, 223 in the secondary scanning direction y. Such a substrate 600, which is not unnecessarily large, contributes to cost reduction.

The image sensor module according to the present invention is not limited to the foregoing embodiment. The specific structure of each part of the image sensor module according to the present invention may be varied in design in many ways.

Variations of the present invention are described below as appendixes.

APPENDIX 1

An image sensor module comprising:
a light source unit for emitting linear light elongated in a primary scanning direction;
a first mirror including a pair of first end surfaces elongated in the primary scanning direction and a first reflective surface sandwiched between the first end surfaces, the first mirror being configured to reflect the linear light, having been reflected by a read object, at the first reflective surface in a secondary scanning direction;
a lens unit for allowing light reflected by the first mirror to pass therethrough;
a second mirror including a pair of second end surfaces elongated in the primary scanning direction and a second reflective surface sandwiched between the second end surfaces, the second mirror being configured to reflect light passing through the lens unit at the second reflective surface in a thickness direction perpendicular to both of the primary scanning direction and the secondary scanning direction;
a sensor IC for receiving light reflected by the second mirror; and
a case integrally formed with the first and the second mirrors and including a pair of first supporting surfaces in contact with the first end surfaces and a pair of second supporting surfaces in contact with the second end surfaces.

APPENDIX 2

The image sensor module as set forth in Appendix 1, wherein the case is elongated in the primary scanning direction and includes a first beam, and one of the first supporting surfaces comprises a surface of the first beam.

APPENDIX 3

The image sensor module as set forth in Appendix 2, wherein the case includes at least one first rib connected to the first beam.

APPENDIX 4

The image sensor module as set forth in Appendix 3, wherein the first rib is in contact with the first mirror.

APPENDIX 5

The image sensor module as set forth in Appendix 3 or 4, wherein the case includes a plurality of the first ribs spaced apart from each other in the primary scanning direction.

APPENDIX 6

The image sensor module as set forth in any one of Appendixes 1 through 5, wherein the case includes a second beam elongated in the primary scanning direction, and one of the second supporting surfaces comprises a surface of the second beam.

APPENDIX 7

The image sensor module as set forth in Appendix 6, wherein the case includes at least one second rib connected to the second beam.

APPENDIX 8

The image sensor module as set forth in Appendix 7, wherein the second rib is in contact with the second mirror.

APPENDIX 9

The image sensor module as set forth in Appendix 7 or 8, wherein the case includes a plurality of the second ribs spaced from each other in the primary scanning direction.

APPENDIX 10

The image sensor module as set forth in any one of Appendixes 1 through 9, wherein the first mirror is inclined 45° with respect to the secondary scanning direction.

APPENDIX 11

The image sensor module as set forth in any one of Appendixes 1 through 10, wherein the second mirror is inclined 45° with respect to the secondary scanning direction.

APPENDIX 12

The image sensor module as set forth in any one of Appendixes 1 through 11, wherein an optical axis of the lens unit crosses the first mirror at a point offset from the center of the first mirror in the thickness direction toward the read object.

APPENDIX 13

The image sensor module as set forth in any one of Appendixes 1 through 12, wherein the optical axis of the lens unit crosses the second mirror at a point offset from the center of the second mirror in the thickness direction toward the read object.

APPENDIX 14

The image sensor module as set forth in any one of Appendixes 1 through 13, wherein the light source unit, the first mirror, the lens unit and the second mirror overlap each other in the thickness direction.

APPENDIX 15

The image sensor module as set forth in any one of Appendixes 1 through 14, further comprising a light shield arranged opposite to the sensor IC across the second mirror in the thickness direction.

APPENDIX 16

The image sensor module as set forth in Appendix 15, wherein the light shield overlaps the second mirror and the lens unit in the secondary scanning direction.

APPENDIX 17

The image sensor module as set forth in Appendix 15 or 16, further comprising a light-transmitting plate arranged closer to the read object in the thickness direction than the light source unit, the first mirror, the lens unit and the second mirror are;
wherein the light shield comprises a light-shielding film formed on the light-transmitting plate.

APPENDIX 18

The image sensor module as set forth in any one of Appendixes 1 through 17, further comprising a substrate on which the sensor IC is mounted, wherein
the light source unit comprises an LED module and a light guide,
the LED module comprising at least one LED chip, at least one lead on which the LED chip is mounted, and a resin package covering part of the lead and formed with an opening exposing the LED chip,
the light guide being elongated in the primary scanning direction and including an incident surface facing the opening, a reflective surface for reflecting light traveling from the incident surface, and an emission surface for emitting light traveling from the reflective surface as linear light elongated in the primary scanning direction,
the lead including a terminal portion projecting, from a position deviated from the opening in the secondary scanning direction, out of the resin package in the thickness direction, and connected to the substrate.

APPENDIX 19

The image sensor module as set forth in Appendix 18, wherein the substrate and at least part of the light guide are arranged so as not to overlap in the secondary scanning direction.

FIGS. 14, 15, 16, 19 and 22 show a document scanner according to a variation of the present invention. The document scanner 110 of this embodiment includes image sensor modules 101A, 101B, a stationary case 120A, a movable case 120B, a pair of driving rollers 781A, and a pair of driven rollers 781B. The document scanner 110 is configured to transfer a read object 890 in the secondary scanning direction y from left to right in FIGS. 15, 19 and 22, and read the content described on the opposite surfaces of the read object 890. Specifically, the image sensor module 101A reads the content described on the lower surface in the thickness direction z of the read object 890, whereas the image sensor module 101B reads the content described on the upper surface in the thickness direction z of the read object 890. For easier understanding, in FIG. 14, the stationary case 120A and the movable case 120B is omitted, and the image sensor module 101B is illustrated as opened relative to the image sensor module 101A. In use, the image sensor module 101B is closed onto the image sensor module 101A.

Figure 15:
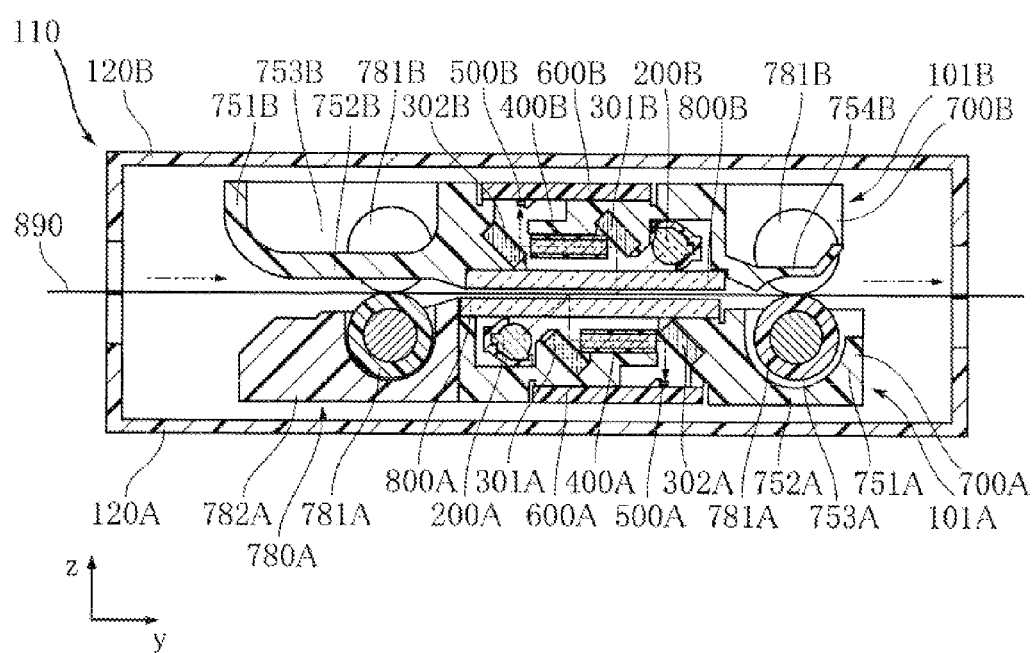
FIG. 15 is a sectional view taken along lines XV-XV in FIG. 14.
Figure 16:
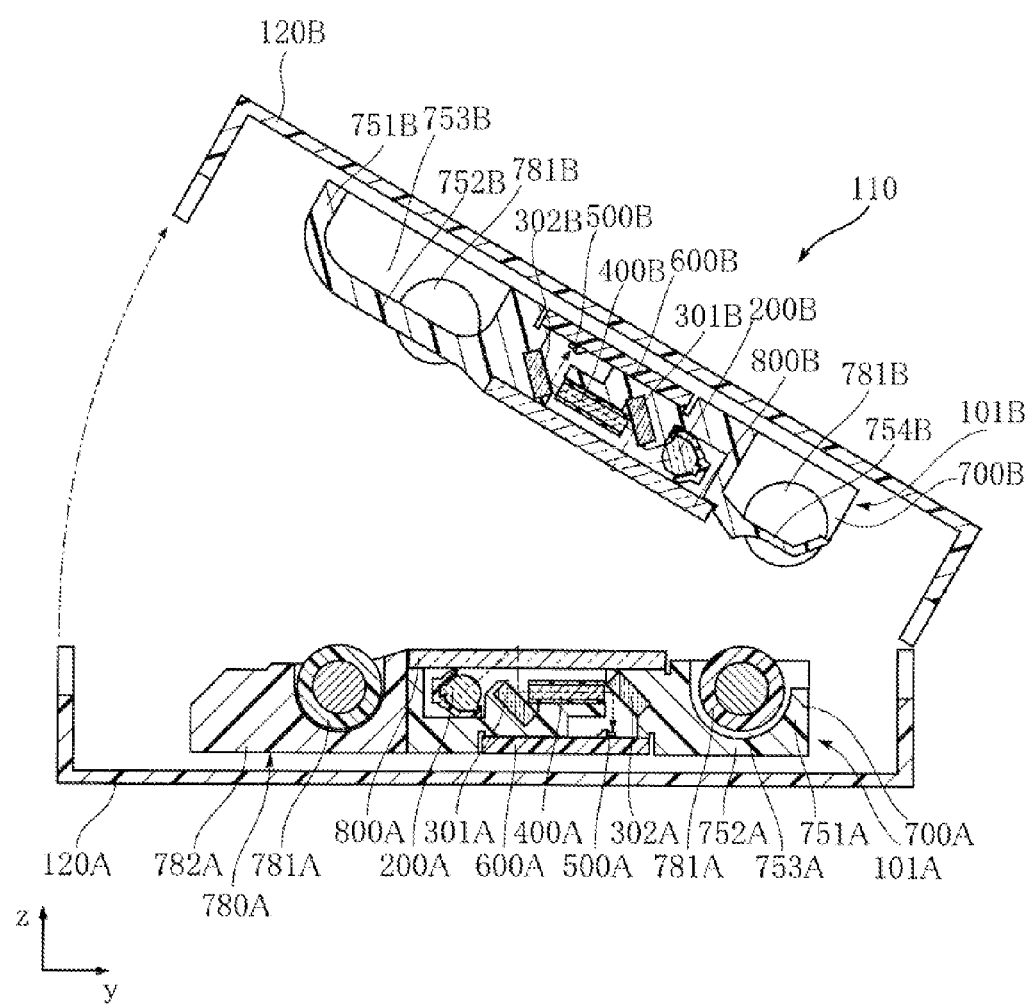
FIG. 16 is a sectional view showing the document scanner of FIG. 14 in a state in which the movable case is opened.

The stationary case 120A and the movable case 120B define the outer configuration of the document scanner 110 and accommodate the image sensor modules 101A, 101B, the paired driving rollers 781A, and the paired driven rollers 781B. As shown in FIGS. 15 and 16, the stationary case 120A is in the form of a box which opens upward in the thickness direction z and accommodates the image sensor module 101A. The movable case 120B is in the form of a box which opens downward in the thickness direction z and accommodates the image sensor module 101B. The movable case 120B is movable to open or close relative to the stationary case 120A. When the movable case 120B is opened, the image sensor module 101B is in a state unfolded relative to the image sensor module 101A.

Figure 17:
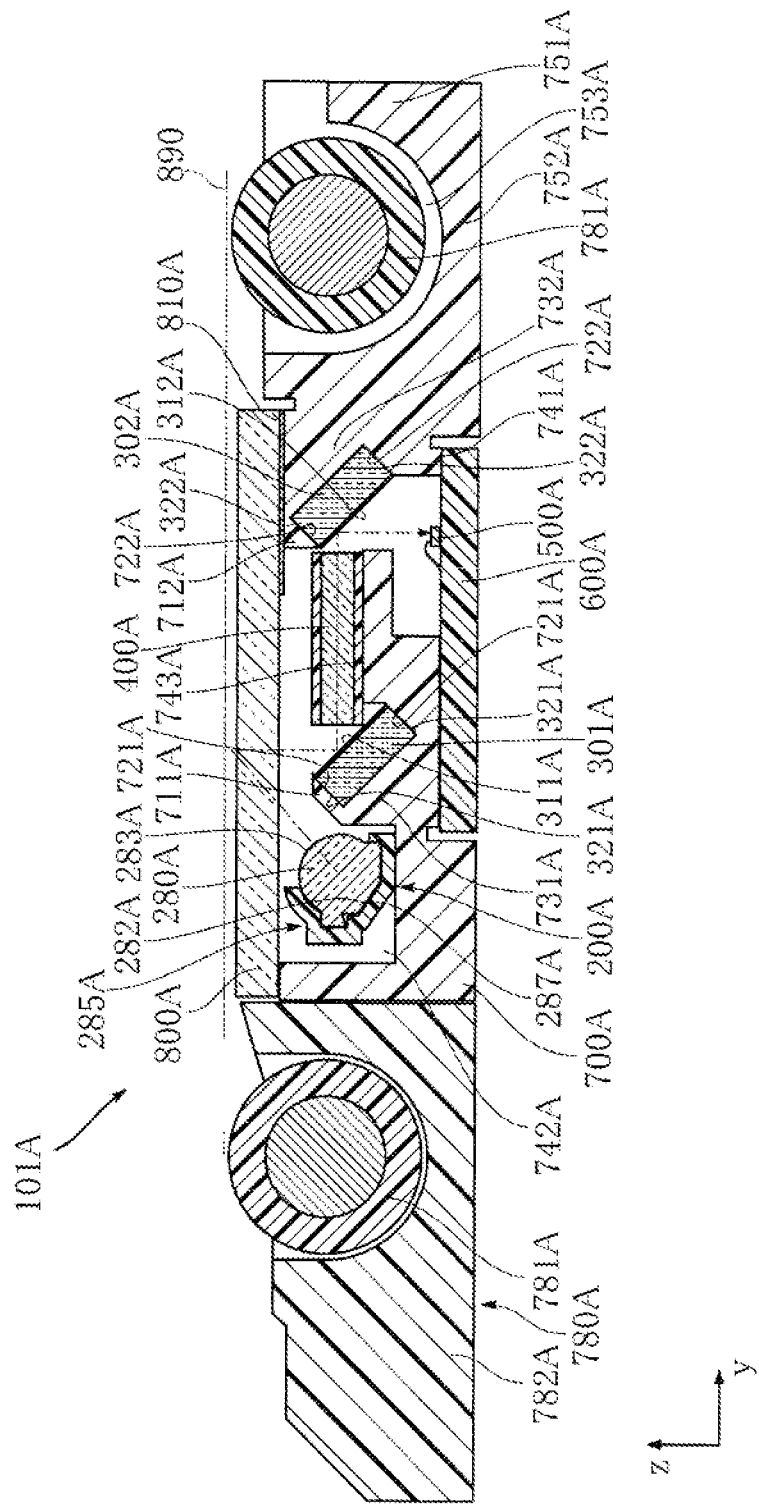
FIG. 17 is a sectional view showing a driving-side image sensor module of the document scanner of FIG. 14.
Figure 19:
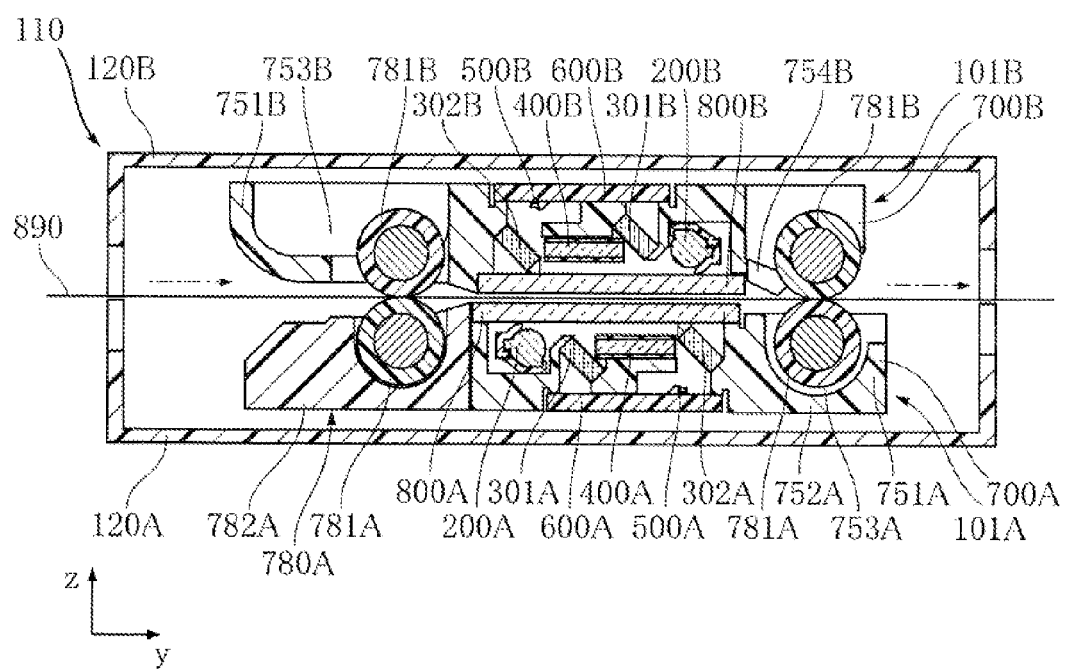
FIG. 19 is a sectional view taken along lines XIX-XIX in FIG. 14.
Figure 20:
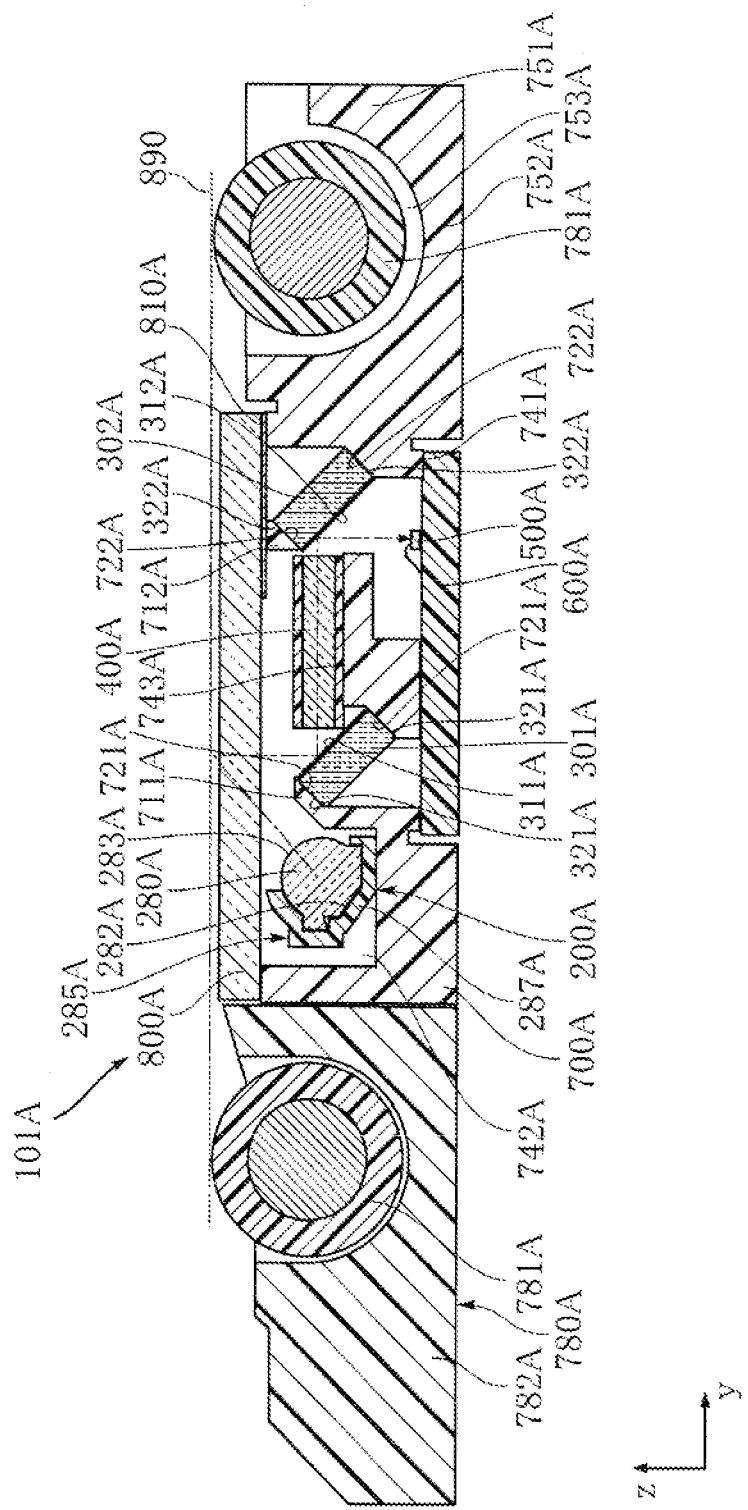
FIG. 20 is a sectional view showing the driving-side image sensor module of the document scanner of FIG. 14.
Figure 23:
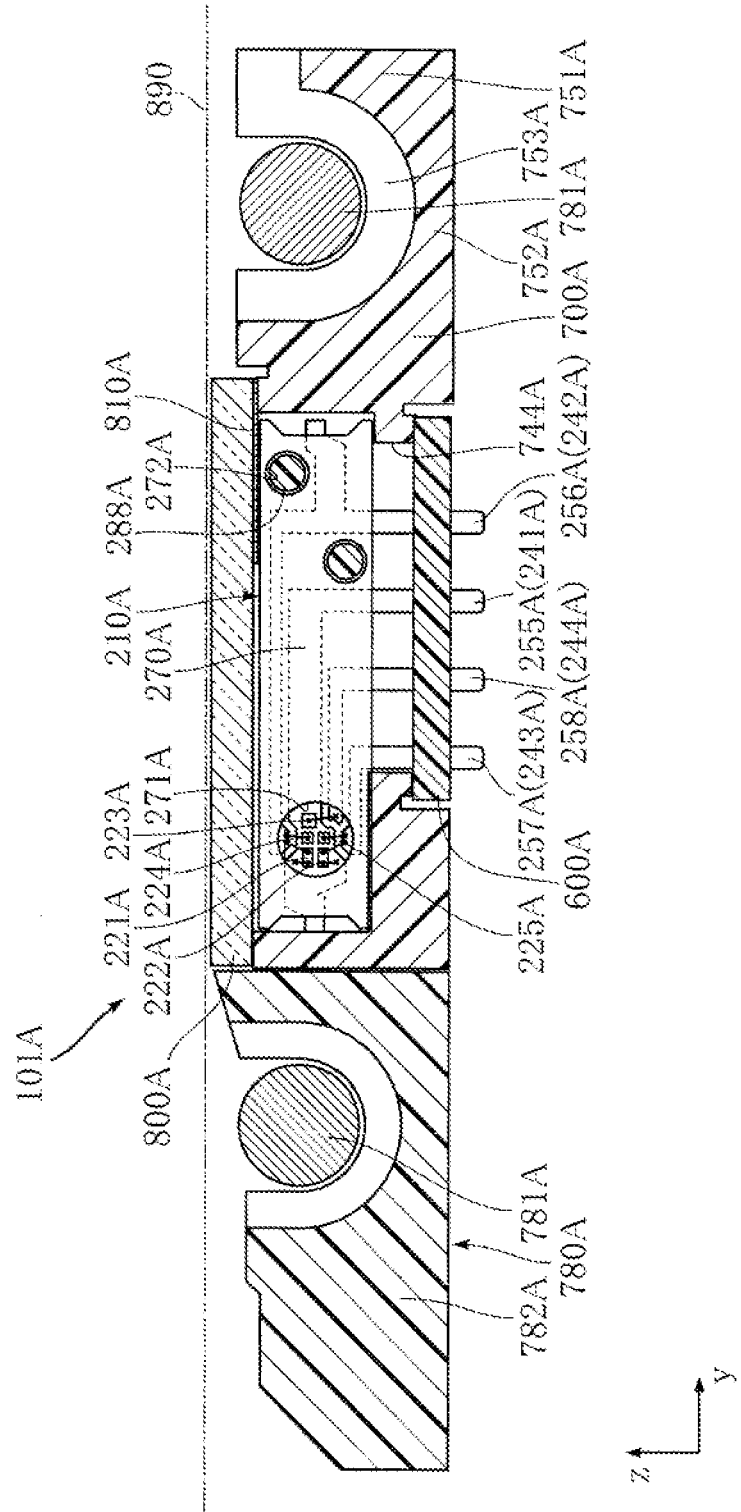
FIG. 23 is a sectional view showing the driving-side image sensor module of the document scanner of FIG. 14.

The image sensor module 101A is an example of the driving-side image sensor module according to this variation of the invention, and includes a light source unit 200A, mirrors 301A, 302A, a lens unit 400A, a sensor IC 500A, a substrate 600A, a case 700A, and a light-transmitting plate 800A. FIG. 17 is a sectional view corresponding to FIG. 15, FIG. 20 is a sectional view corresponding to FIG. 19, and FIG. 23 is a sectional view corresponding to FIG. 22.

The case 700A defines the outer configuration of the image sensor module 101A and houses other structural elements. The case 700A is elongated in the primary scanning direction x and is generally rectangular in cross section defined by the secondary scanning direction y and the thickness direction z. Examples of the material for the case 700A include liquid crystal polymer resin.

As shown in FIGS. 14, 17, 20 and 23, the case 700A includes beams 711A, 712A, a pair of supporting surfaces 721A, a pair of supporting surfaces 722A, a plurality of ribs 731A, a plurality of ribs 732A, a substrate receiving portion 741A, a light guide receiving portion 742A, a lens unit receiving portion 743A, a terminal-receiving through-hole 744A, an outer beam 751A and a connection portion 752A.

The terminal-receiving through-hole 744A is provided at one of the ends of the case 700A which are spaced from each other in the primary scanning direction x. As shown in FIG. 23, the terminal-receiving through-hole 744A penetrates the case 700A in the thickness direction z and is rectangular in cross section.

The light guide receiving portion 742A is elongated in the primary scanning direction x and arranged at a position closer to one of the ends which are spaced from each other in the secondary scanning direction y, as shown in FIGS. 17 and 20. The light guide receiving portion 742A is generally rectangular in cross section and opens upward in the thickness direction z.

Figure 14:
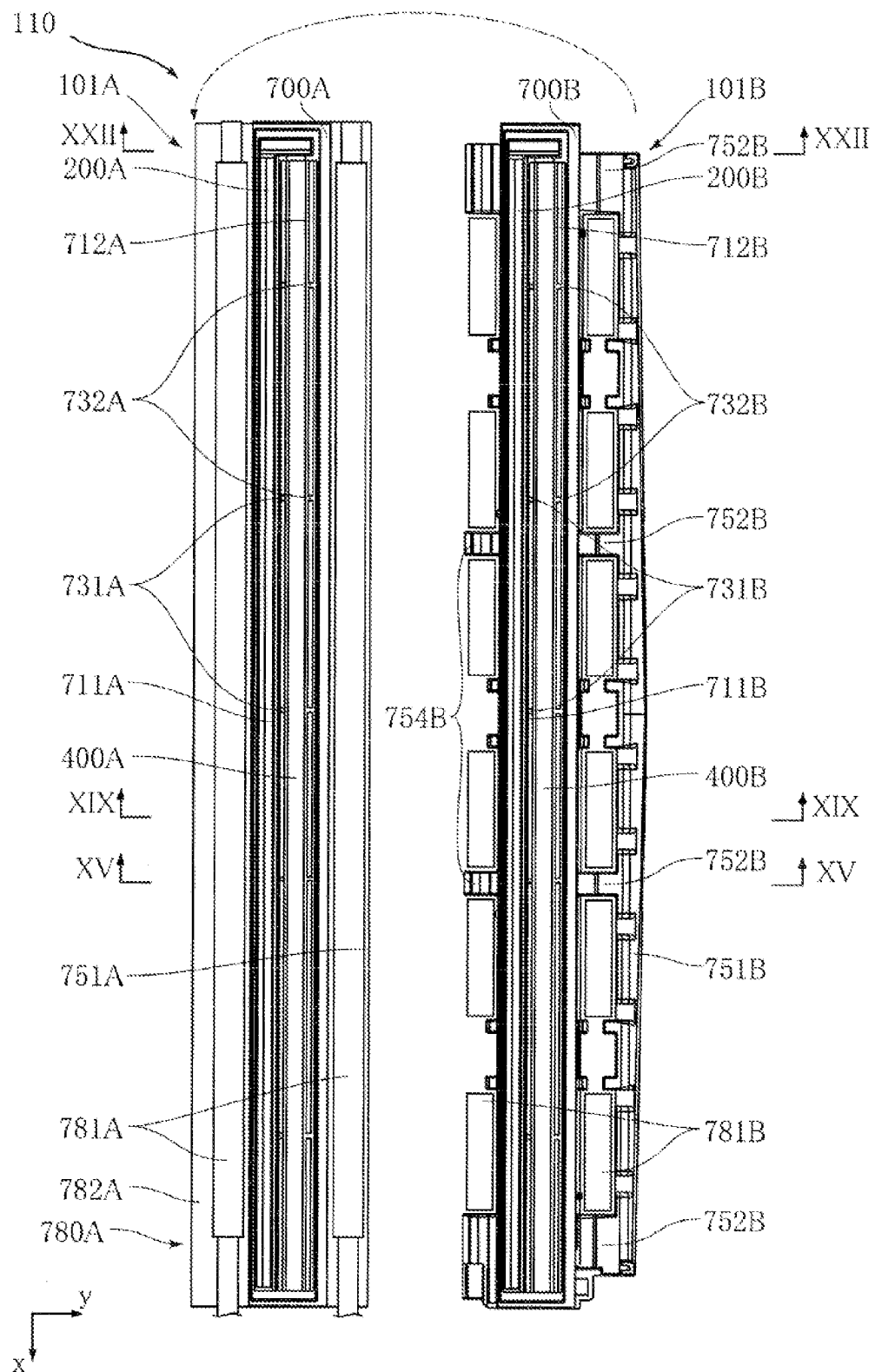
FIG. 14 is an exploded plan view showing a document scanner according to a variation of the present invention.

The beam 711A corresponds to the first driving-side beam according to this variation of the invention and is elongated in the primary scanning direction x, as shown in FIG. 14. As shown in FIGS. 17 and 20, the beam 711A is adjacent to the light guide receiving portion 742A in the secondary scanning direction y. In this embodiment, the beam 711A includes a surface facing upward in the thickness direction z, and a pair of inclined surfaces inclined with respect to the secondary scanning direction y and the thickness direction z. The one of the paired inclined surfaces that is on the lower right side in the figure and a surface which faces this inclined surface are the paired supporting surfaces 721A. The supporting surfaces 721A correspond to the first driving-side supporting surfaces of this variation of the invention.

As shown in FIG. 14, the ribs 731A are arranged at equal intervals in the primary scanning direction x. As shown in FIG. 17, each of the ribs 731A is connected to the beam 711A, and in contact with the mirror 301A in this embodiment.

As shown in FIGS. 17 and 20, the lens unit receiving portion 743A is arranged adjacent to the center of the case 700 in the secondary scanning direction y.

The beam 712A corresponds to the second driving-side beam according to this variation of the present invention and is elongated in the primary scanning direction x, as shown in FIG. 14. As shown in FIGS. 17 and 20, in the secondary scanning direction y, the beam 712A is on the opposite side of the beam 711A across the lens unit receiving portion 743A. In this embodiment, the beam 712A includes a surface facing upward in the thickness direction z, a surface facing to the left in the secondary scanning direction y, and an inclined surface inclined with respect to the secondary scanning direction y and the thickness direction z. Thus, the beam 712A is generally triangular in cross section. The inclined surface of the beam 712A and a surface facing the inclined surface are the paired supporting surfaces 722A. The supporting surfaces 722A correspond to the second driving-side supporting surfaces of this variation of the invention.

As shown in FIG. 14, the ribs 732A are arranged at equal intervals in the primary scanning direction x. As shown in FIG. 17, each of the ribs 732A is connected to the beam 712A, and in contact with the mirror 302A in this embodiment.

The substrate receiving portion 741A is elongated in the primary scanning direction x, and is open downward in the thickness direction z, as shown in FIGS. 17 and 20.

The outer beam 751A is an example of the driving-side outer beam of this variation of the invention and elongated in the primary scanning direction x, as shown in FIG. 14. As shown in FIGS. 17, 20 and 23, the outer beam 751A is in the form of a wall standing in the thickness direction z. The connection portion 752A is an example of the driving-side connection portion of the variation of the invention and supports the outer beam 751A. The connection portion 752A is connected to the lower end of the outer beam 751A in the thickness direction z and positioned at the lower end of the case 700A in the thickness direction z. The connection portion 752A is continuous in the primary scanning direction x and has a uniform shape in cross section perpendicular to the primary scanning direction x. The space surrounded by the outer beam 751A and the connection portion 752A is a driving roller receiving portion 753A.

The substrate 600A comprises an insulating member made of e.g. a ceramic material or a glass-fiber-reinforced epoxy resin, and a wiring pattern (not shown) formed on the insulating member. The substrate 600A is in the form of a rectangle elongated in the primary scanning direction x. The substrate 600A is housed in the substrate receiving portion 741A of the case 700A and fixed to the case 700 with e.g. an adhesive. As shown in FIGS. 17 and 20, on the substrate 600A is mounted the sensor IC 500A.

The light-transmitting plate 800A is a plate member made of a transparent material such as glass and attached to cover the upper side of the case 700A in the thickness direction z.

The light source unit 200A is a unit for emitting linear light necessary for image reading by the image sensor module 101A and includes an LED module 210A, a light guide 280A, and a reflector 285A.

Figure 25:
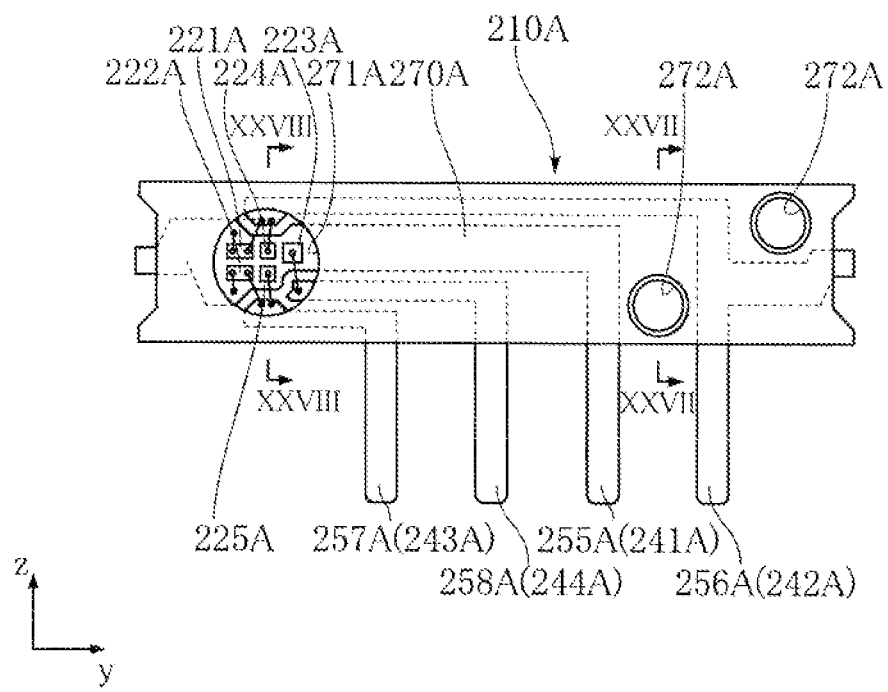
FIG. 25 is a front view showing an LED module of a light source unit of the driving-side image sensor module of the document scanner shown in FIG. 14.
Figure 26:
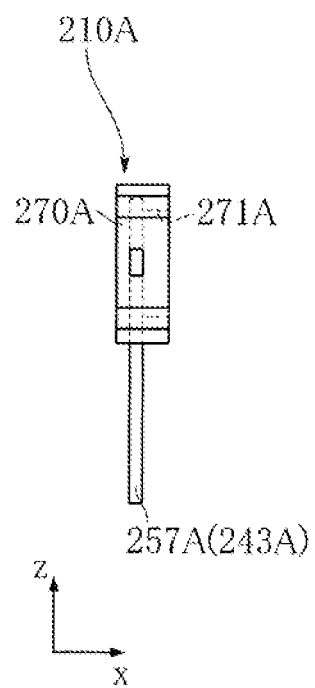
FIG. 26 is a side view showing the LED module of a light source unit of the driving-side image sensor module of the document scanner shown in FIG. 14.

The LED module 210A achieves the light emitting function of the light source unit 200A. As shown in FIGS. 25 and 26, the LED module 210A includes LED chips 221A, 222A, 223A, Zener diodes 224A, 225A, leads 241A, 242A, 243A, 244A and a resin package 270A.

The resin package 270A is made of a white resin such as liquid crystal polymer resin or an epoxy resin and covers part of each lead 241A, 242A, 243A, 244A. The resin package 270A includes an opening 271A and a plurality of positioning holes 272A. The opening 271A is provided adjacent to one of the ends of the resin package 270A which are spaced from each other in the secondary scanning direction y and is circular in cross section. The positioning holes 272A are provided at positions avoiding the leads 241A, 242A, 243A, 244A and penetrate the resin package 270A in this embodiment.

Figure 29:
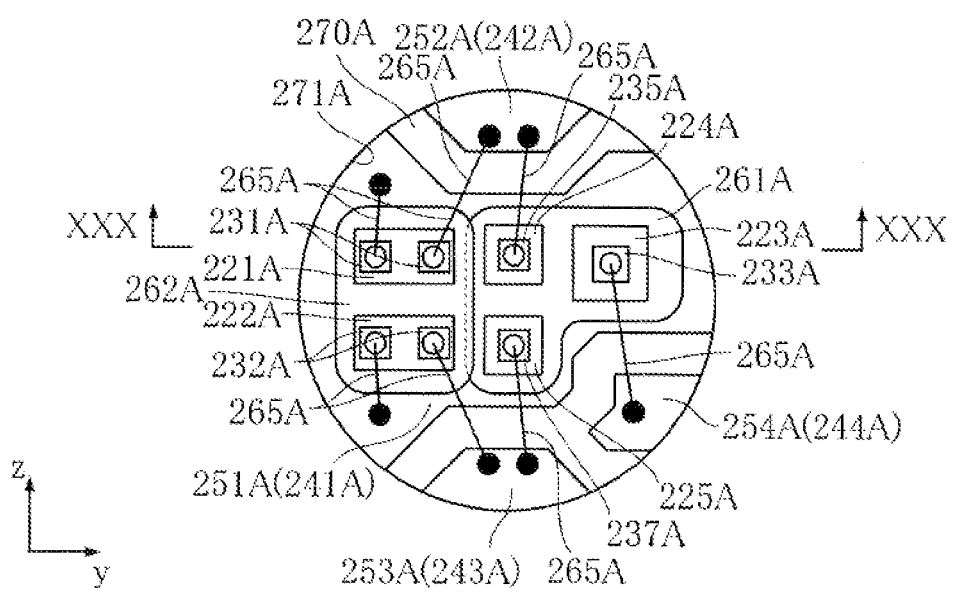
FIG. 29 is an enlarged front view schematically showing the opening of the LED module of FIG. 25.

As shown in FIGS. 25 and 29, the lead 241A includes a mount portion 251A and a terminal portion 255A. The lead 241A includes a portion elongated in the secondary scanning direction y and a portion elongated in the thickness direction z. The mount portion 251A is provided adjacent to the left end in the figure of the portion elongated in the secondary scanning direction y. On the mount portion 251A, the LED chips 221A, 222A, 223A and the Zener diodes 224A, 225A are mounted. In this embodiment, the mount portion 251A is partially narrowed in the thickness direction z as compared with adjacent portions of the lead 241A. The mount portion 251A is exposed through the opening 271A of the resin package 270A. The terminal portion 255A projects downward from the resin package 270A in the thickness direction z and is connected to the substrate 600A.

The lead 242A includes a wire bonding portion 252A and a terminal portion 256A. The lead 242A includes a portion elongated in the secondary scanning direction y and a portion elongated in the thickness direction z. The wire bonding portion 252A is provided adjacent to the left end in the figure of the portion elongated in the secondary scanning direction y. In this embodiment, the wire bonding portion 252A projects downward in the thickness direction z toward the mount portion 251A of the lead 241A. The wire bonding portion 252A is exposed through the opening 271A of the resin package 270A. The terminal portion 256A projects downward from the resin package 270A in the thickness direction z and is connected to the substrate 600A.

The lead 243A includes a wire bonding portion 253A and a terminal portion 257A. The lead 243A includes a portion elongated in the secondary scanning direction y and a portion elongated in the thickness direction z. The wire bonding portion 253A is provided adjacent to the left end in the figure of the portion elongated in the secondary scanning direction y. In this embodiment, the wire bonding portion 253A projects upward in the thickness direction z toward the mount portion 251A of the lead 241A. The wire bonding portion 253A is exposed through the opening 271A of the resin package 270A. The terminal portion 257A projects downward from the resin package 270A in the thickness direction z and is connected to the substrate 600A.

The lead 244A includes a wire bonding portion 254A and a terminal portion 258A. The lead 294A includes a portion elongated in the secondary scanning direction y and a portion elongated in the thickness direction z. The wire bonding portion 254A is provided adjacent to the left end in the figure of the portion elongated in the secondary scanning direction y. In this embodiment, the wire bonding portion 254A is positioned at the lower right in the figure of the mount portion 251A and on the right side in the figure of the wire bonding portion 253A. The wire bonding portion 254A is exposed through the opening 271A of the resin package 270A. The terminal portion 258A projects downward from the resin package 270A in the thickness direction z and is connected to the substrate 600A.

Figure 30:
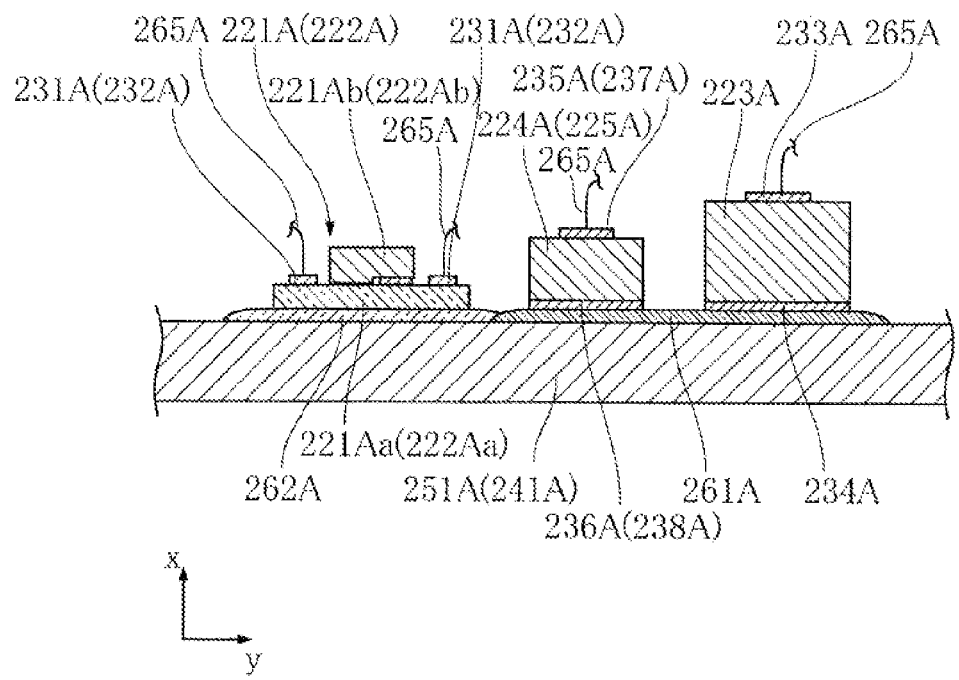
FIG. 30 is a schematic sectional view taken along lines XXX-XXX in FIG. 29.

In this embodiment, the LED chip 221A emits green light. As shown in FIGS. 29 and 30, the LED chip 221A includes a submount substrate 221Aa, a semiconductor layer 221Ab, and a pair of front electrodes 231A. The submount substrate 221Aa is made of e.g. Si and transparent. The semiconductor layer 221Ab is made of e.g. GaN-based semiconductor, and includes an n-type semiconductor layer, a p-type semiconductor layer and an active layer sandwiched between the n-type semiconductor layer and the p-type semiconductor layer (none shown). The front electrodes 231A are provided on the submount substrate 221Aa and electrically connected to the n-type semiconductor layer and the p-type semiconductor layer.

In this embodiment, the LED chip 222A emits blue light. For easier understanding, the references signs indicating the structural elements of the LED chip 222A corresponding to those of the LED chip 221A are shown in parentheses in FIG. 30. The LED chip 222A includes a submount substrate 222Aa, a semiconductor layer 222Ab, and a pair of front electrodes 232A. The submount substrate 222Aa is made of e.g. Si and transparent. The semiconductor layer 222Ab is made of e.g. GaN-based semiconductor material, and includes an n-type semiconductor layer, a p-type semiconductor layer and an active layer sandwiched between the n-type semiconductor layer and the p-type semiconductor layer (none shown). The front electrodes 232A are provided on the submount substrate 222Aa and electrically connected to the n-type semiconductor layer and the p-type semiconductor layer.

In this embodiment, the LED chip 223A emits red light. As shown in FIGS. 29 and 30, the LED chip 223A includes a semiconductor layer made of e.g. GaAs-based semiconductor material, a front electrode 233A and a back electrode 234A. The semiconductor layer includes an n-type semiconductor layer, a p-type semiconductor layer and an active layer sandwiched between the n-type semiconductor layer and the p-type semiconductor layer (none shown). The front electrode 233A is provided on a side of the LED chip 223A which is opposite from the lead 241A. The back electrode 234A is provided on the lead 241A side of the LED chip 223A.

The Zener diode 224A serves to prevent excessive voltage application to the LED chip 221A. The Zener diode 224A includes a front electrode 235A and a back electrode 236A. The Zener diode 225A serves to prevent excessive voltage application to the LED chip 222A. The Zener diode 225A includes a front electrode 237A and a back electrode 238A.

The LED chips 221A and 222A are spaced from each other in the thickness direction z and mounted on the mount portion 251A of the lead 241A via an insulating layer 262A. In this embodiment, the insulating layer 262A is transparent and made of e.g. a transparent resin. The Zener diodes 224A and 225A are spaced from each other in the thickness direction z and positioned on the right side of the LED chips 221A and 222A in the secondary scanning direction y. The LED chip 223A is arranged on the opposite side of the LED chips 221A and 222A across the Zener diodes 224A and 225A in the secondary scanning direction y. The LED chip 223A and the Zener diodes 224A, 225A are mounted on the mount portion 251A of the lead 241A via a conductive layer 261A. Specifically, the back electrode 234A of the LED chip 223A and the back electrodes 236A, 238A of the Zener diodes 224A, 225A are electrically connected to the lead 241A via the conductive layer 261A. The conductive layer 261A is made of e.g. Ag.

The mounting process of the LED chips 221A, 222A, 223A and Zener diodes 224A, 225A is performed as follows. First, conductive paste as the material for the conductive layer 261A is applied to the mount portion 251A of the lead 241A. Then, the LED chip 223A and the Zener diodes 224A, 225A are bonded. Then, the conductive paste is hardened by e.g. baking, whereby the conductive layer 261A is obtained. Then, resin paste as the material for the insulating layer 262A is applied to the mount portion 251A. Then, the LED chips 221A and 222A are bonded. Then, the resin paste is hardened, whereby the insulating layer 262A is obtained.

In the above-described process, the insulating layer 262A is formed after the conductive layer 261A is formed. Thus, in the case where the application area of the conductive paste and the application area of the resin paste overlap each other, the conductive layer 261A intervenes between part of the insulating layer 262A and the mount portion 251A of the lead 241A. Shown in FIGS. 29 and 30 are the conductive layer 261A and the insulating layer 262A in this state. Depending on the application areas, the conductive layer 261A and the insulating layer 262A may not overlap each other. However, it is to be noted that, according to the above-described process, the insulating layer 262A never intervenes between the conductive layer 261A and the mount portion 251A of the lead 241A.

One of the paired front electrodes 231A of the LED chip 221A is connected to the mount portion 251A of the lead 241A with a wire 265A, whereas the other of the front electrodes 231A is connected to the wire bonding portion 252A of the lead 242A with a wire 265A. One of the paired front electrodes 232A of the LED chip 222A is connected to the mount portion 251A of the lead 241A with a wire 265A, whereas the other of the front electrodes 232A is connected to the wire bonding portion 253A of the lead 243A with a wire 265A.

The front electrode 233A of the LED chip 223A is connected to the wire bonding portion 254A of the lead 244A with a wire 265A. The front electrode 235A of the Zener diode 224A is connected to the wire bonding portion 252A of the lead 242A with a wire 265A. The front electrode 237A of the Zener diode 225A is connected to the wire bonding portion 253A of the lead 243A with a wire 265A.

Figure 28:
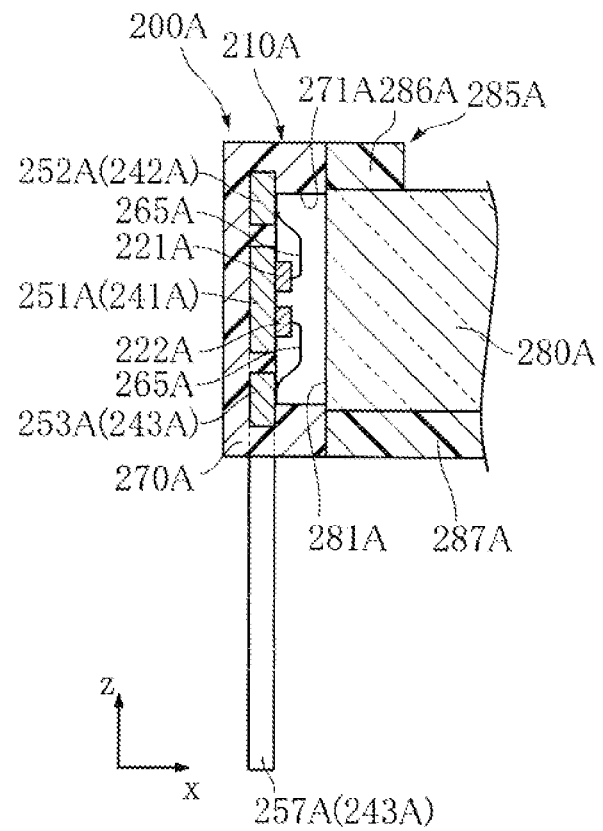
FIG. 28 is a schematic sectional view of the light source unit taken along lines XXVIII-XXVIII in FIG. 25.

The light guide 280A is provided for converting the light emitted from the LED module 210A into linear light elongated in the primary scanning direction x and made of a transparent acrylic resin such as PMMA (polymethyl methacrylate). The light guide 280A has a generally columnar shape elongated in the primary scanning direction x, and includes an incident surface 281A, a reflective surface 282A and an emission surface 283A, as shown in FIGS. 17, 20 and 28.

The incident surface 281A is one of the end surfaces of the light guide 280A which are spaced from each other in the primary scanning direction x. The incident surface 281A covers the opening 271A of the resin package 270A of the LED module 210A and faces the LED chips 221A, 222A and 223A. The reflective surface 282A is a surface elongated in the primary scanning direction x and formed at the lower left portion of the light guide 280A in FIGS. 17 and 20. The reflective surface 282A reflects the light traveling within the light guide 280A after entering through the incident surface 281A. For instance, the reflective surface 282A may be a surface with minute irregularities or a surface to which white paint is applied. The emission surface 283A is a surface elongated in the primary scanning direction x and arcuate in cross section in this embodiment. The light reflected at the reflective surface 282A is emitted from the emission surface 283A as linear light elongated in the primary scanning direction x.

Figure 27:
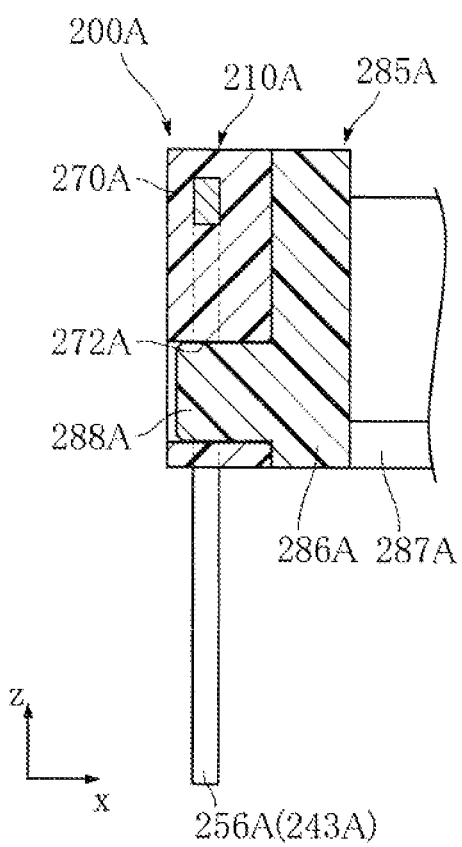
FIG. 27 is a schematic sectional view of the light source unit taken along lines XXVII-XXVII in FIG. 25.

The reflector 285A functions to position the light guide 280A relative to the LED module 210A and prevents unfavorable leaking of light from the light guide 280A. The reflector 285A is made of e.g. white resin. The reflector 285A includes a base portion 286A and a semicylindrical portion 287A. The base portion 286A is in the form of a rectangular plate similar in size and shape to the resin package 270A of the LED module 210A as viewed in the primary scanning direction x. The base portion 286A is provided with a plurality of projections 288A. As shown in FIG. 27, each of the projections 288A is fitted in a respective one of the positioning holes 272A of the resin package 270A of the LED module 210A. With this arrangement, the reflector 285A is positioned relative to the LED module 210A.

The semicylindrical portion 287A is elongated in the primary scanning direction x, and holds in it the light guide 280A, as shown in FIGS. 17 and 20. Of the semicylindrical portion 287A, the portion facing the reflective surface 282A of the light guide 280A functions to return the light exiting the light guide 280A through the reflective surface 282A into the light guide 280A. By holding the light guide 280A in the semicylindrical portion 287A, the light guide 280A is fixed to the reflector 285A. Accordingly, the light guide 280A is positioned relative to the LED module 210A, along with the reflector 285A.

As shown in FIG. 23, the LED chips 221A, 222A, 223A and the light guide 280A are arranged at a position deviated to the left from the terminal portions 255A, 256A, 257A, 258A in the secondary scanning direction y. The substrate 600A has a dimension in the secondary scanning direction y just enough for connection to the terminal portions 255A, 256A, 257A, 258A and does not have any extra space. The LED chips 221A, 222A, 223A and the light guide 280A are arranged at a position deviated to the left from the substrate 600A in the secondary scanning direction y. In this embodiment, the light guide 280A and the substrate 600A do not overlap at all in the secondary scanning direction y. However, this variation of the invention is not limited to this, and the light guide 280A and the substrate 600A may partially overlap in the secondary scanning direction y.

The mirror 301A corresponds to the first driving-side mirror of this variation of the invention. The mirror 301A is elongated in the primary scanning direction x. The mirror 301A has a reflective surface 311A and a pair of end surfaces 321A, as shown in FIGS. 17 and 20. The reflective surface 311A corresponds to the first driving-side reflective surface of this variation of the invention. The light emitted from the light source unit 200A and then reflected at the read object 890 is reflected at the reflective surface 311A in the secondary scanning direction y. In this embodiment, the reflective surface 311A is inclined 45° with respect to the secondary scanning direction y and the thickness direction z. The paired end surfaces 321A correspond to a pair of first driving-side end surfaces of the variation of the invention and are oriented in opposite directions, with the reflective surface 311A intervening between them. The end surfaces 321A are elongated in the primary scanning direction x and parallel to each other. The end surfaces 321A are in contact with the supporting surfaces 721A of the case 700A. The surface of the mirror 301A which is opposite to the reflective surface 311A is in contact with the ribs 731A.

The light traveling in the secondary scanning direction y after being reflected at reflective surface 311A of the mirror 301A passes through the lens unit 400A. The lens unit 400A is made up of a plurality of rod lenses and a case made of e.g. resin and accommodating the rod lenses. The rod lenses are configured to form an erecting equal-magnification image of the content of the read object 890 onto the sensor IC 500A. The optical axis of the rod lenses extends in the secondary scanning direction y and perpendicularly to the primary scanning direction x. The lens unit 400A is housed in the lens unit receiving portion 743A of the case 700A.

The mirror 302A corresponds to the second driving-side mirror of this variation of the invention. The mirror 302A is elongated in the primary scanning direction x. The mirror 302A has a reflective surface 312A and a pair of end surfaces 322A. The reflective surface 312A corresponds to the second driving-side reflective surface of the variation of the invention. The light passing through the lens unit 400A is reflected at the reflective surface 312A in the thickness direction z. In this embodiment, the reflective surface 312A is inclined 45° with respect to the secondary scanning direction y and the thickness direction z. The paired end surfaces 322A correspond to a pair of second driving-side end surfaces of the variation of the invention and are oriented in opposite directions, with the reflective surface 312A intervening between them. The end surfaces 322A are elongated in the primary scanning direction x and parallel to each other. The end surfaces 322A are in contact with the supporting surfaces 722A of the case 700A. The surface of the mirror 302A which is opposite to the reflective surface 312A is in contact with the ribs 732A.

The optical axis of the lens unit 400A, which extends in the secondary scanning direction y, crosses the reflective surfaces 311A, 312A of the mirrors 301A, 302A. The crossing point of the optical axis of the lens unit 400A and the reflective surface 311A of the mirror 301A is positioned higher than the center of the reflective surface 311A in the thickness direction z. The crossing point of the optical axis of the lens unit 400A and the reflective surface 312A of the mirror 302A is positioned higher than the center of the reflective surface 312A in the thickness direction z.

The case 700A is made by using a resin material such that the mirrors 301A, 302A become integral with the case. As shown in FIG. 20, at positions along the primary scanning direction x where the ribs 731A, 732A are not provided, the reflective surface 311A and the opposite surface of the mirror 301A, as well as the reflective surface 312A and the opposite surface of the mirror 302A are exposed in the thickness direction z. To make the case 700A, the mirrors 301A and 302A are held by a jig from above and below in the thickness direction z. After the mirrors 301A and 302A, along with the jig, are placed in a mold, a resin material is injected into the mold and then hardened. By this process, the case 700A integrally formed with the mirrors 301A, 302A is obtained.

The sensor IC 500A is an element having a photoelectric conversion function to convert received light into electric signals, and mounted on the substrate 600A, as shown in FIGS. 17 and 20. The sensor IC 500A includes a plurality of light-receiving surfaces (not shown) arranged in a row extending in the primary scanning direction x. The light reflected at the read object 890 is converged by the lens unit 400A onto the light receiving surfaces. The sensor IC 500A is a driving-side sensor IC of the variation of the invention.

As shown in FIGS. 17, 20 and 23, the light-transmitting plate 800A is provided with a light-shielding film 810A. The light-shielding film 810A is an example of the driving-side light shield of the variation of the invention and formed by applying black paint or attaching a black resin tape to part of the lower surface of the light-transmitting plate 800A. The light-shielding film 810A is elongated in the primary scanning direction x, and overlaps the entirety of the mirror 302A and the right end of the lens unit 400A in the secondary scanning direction y. The driving-side light shield of the variation of the invention is not limited to the light-shielding film 810A. For instance, the driving-side light shield may comprise part of the case 700A.

Figure 18:
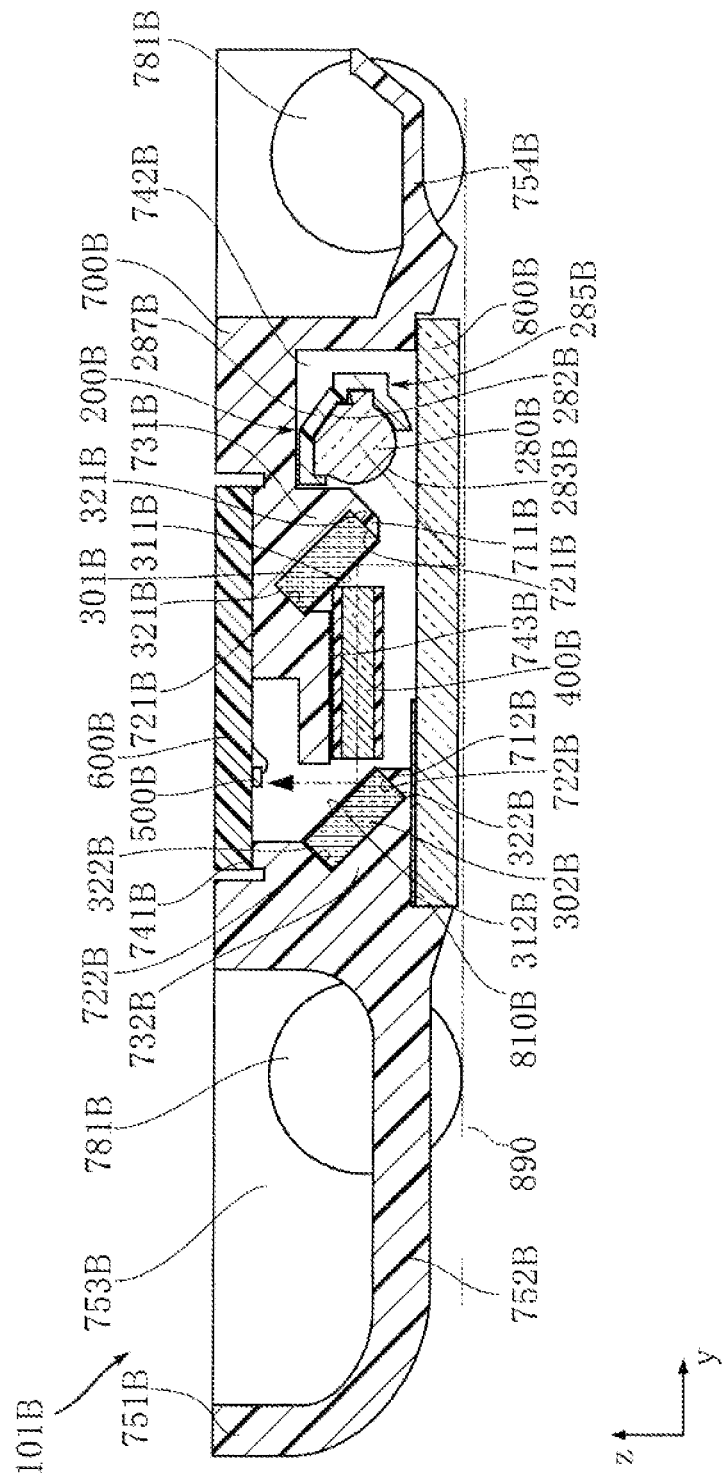
FIG. 18 is a sectional view showing a driven-side image sensor module of the document scanner of FIG. 14.
Figure 21:
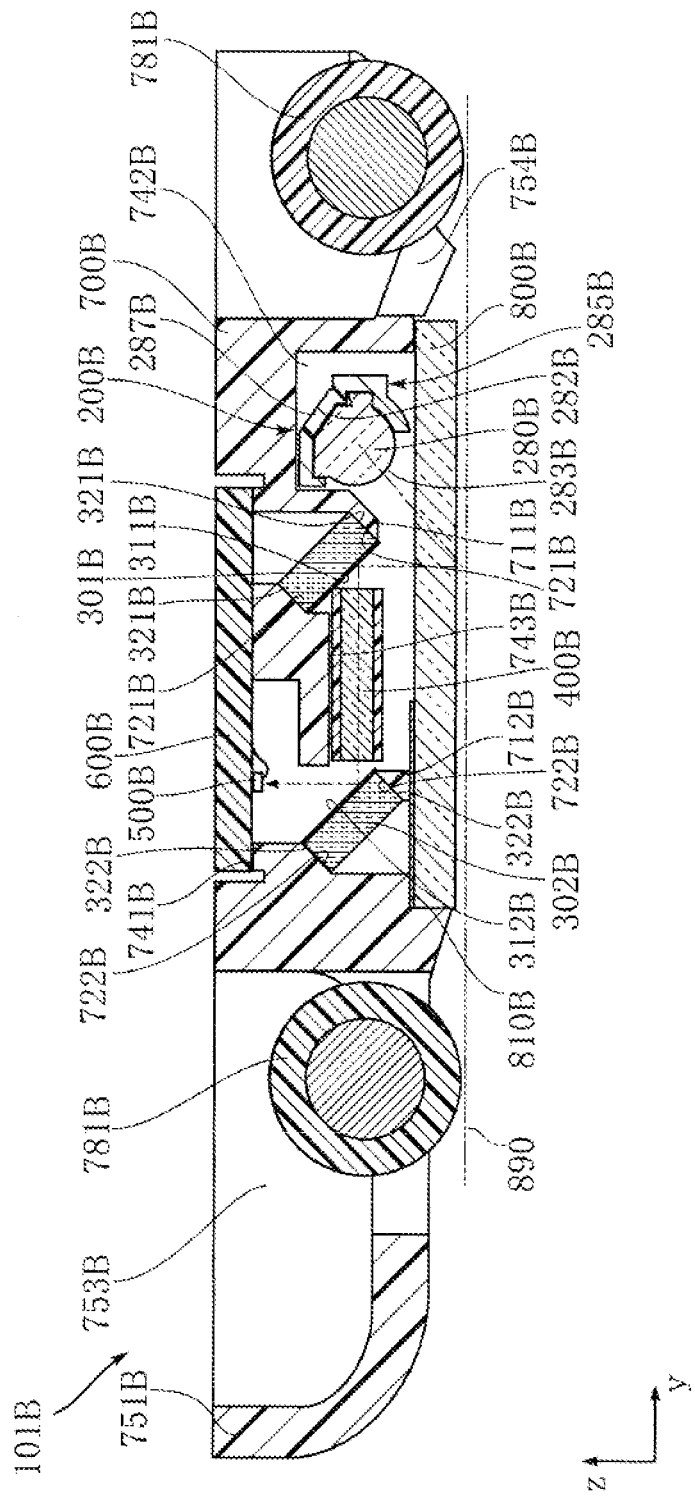
FIG. 21 is a sectional view showing the driven-side image sensor module of the document scanner of FIG. 14.
Figure 22:
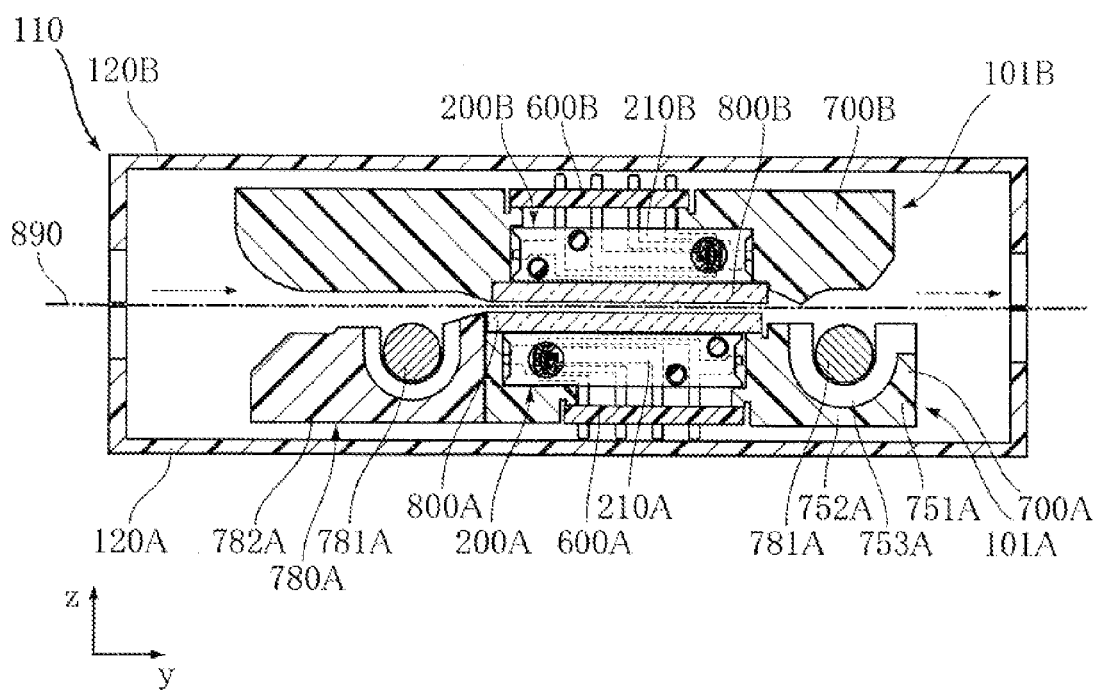
FIG. 22 is a sectional view taken along lines XXII-XXII in FIG. 14.
Figure 24:
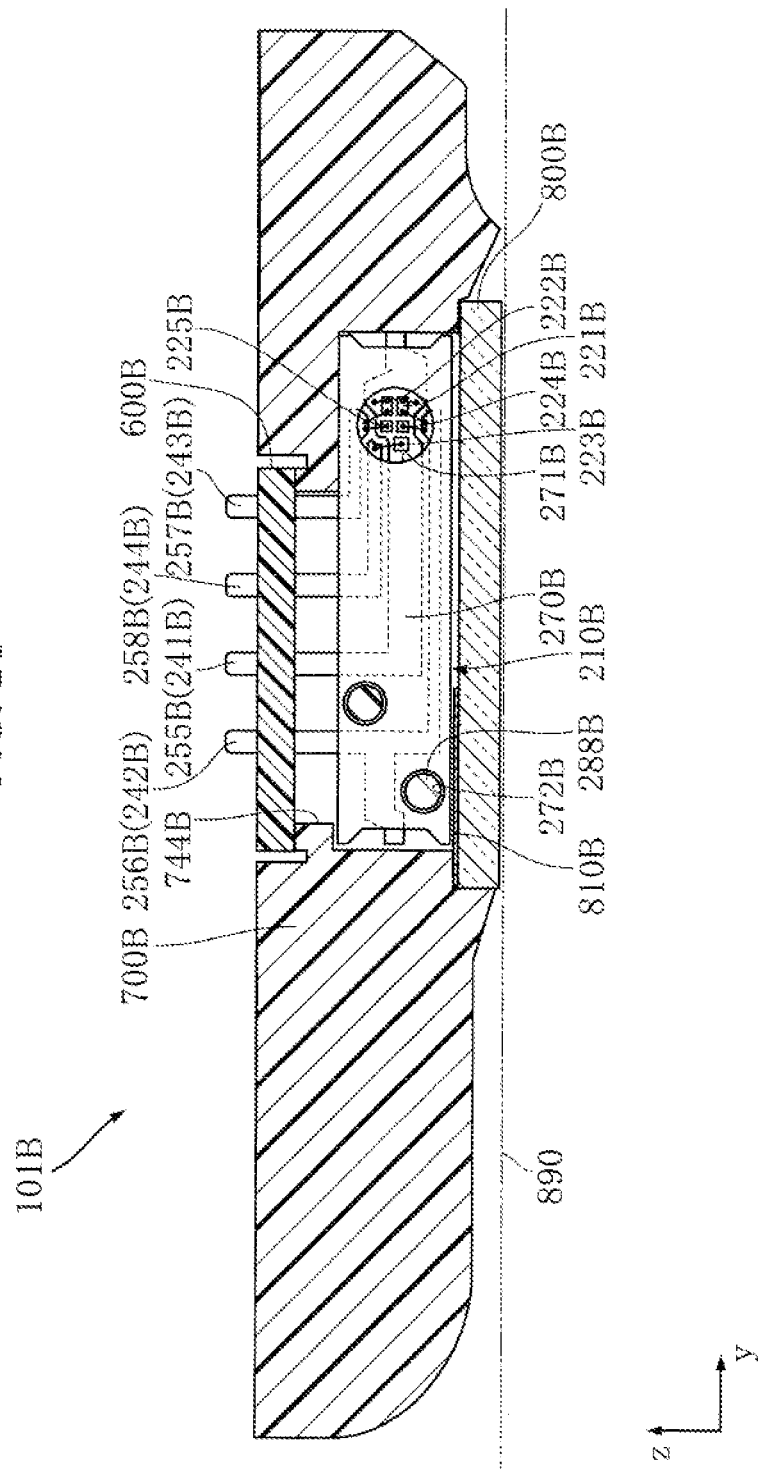
FIG. 24 is a sectional view showing the driven-side image sensor module of the document scanner of FIG. 14.

The image sensor module 101B is an example of the driven-side image sensor module according to this variation of the invention, and includes a light source unit 200B, mirrors 301B, 302B, a lens unit 400B, a sensor IC 500B, a substrate 600B, a case 700B, and a light-transmitting plate 800B. FIG. 18 is a sectional view corresponding to FIG. 15, FIG. 21 is a sectional view corresponding to FIG. 19, and FIG. 24 is a sectional view corresponding to FIG. 22.

The case 700B defines the outer configuration of the image sensor module 101B and houses other structural elements. The case 700B is elongated in the primary scanning direction x and is generally rectangular in cross section defined by the secondary scanning direction y and the thickness direction z. Examples of the material for the case 700B include liquid crystal polymer resin.

As shown in FIGS. 14, 18, 21 and 24, the case 700B includes beams 711B, 712B, a pair of supporting surfaces 721B, a pair of supporting surfaces 722B, a plurality of ribs 731B, a plurality of ribs 732B, a substrate receiving portion 741B, a light guide receiving portion 742B, a lens unit receiving portion 743B, a terminal-receiving through-hole 744B, an outer beam 751B, a plurality of connection ribs 752B, and a plurality of guide ribs 754B.

The terminal-receiving through-hole 744B is provided at one of the ends of the case 700B which are spaced from each other in the primary scanning direction x. As shown in FIG. 24, the terminal-receiving through-hole 744B penetrates the case 700B in the thickness direction z and is rectangular in cross section.

The light guide receiving portion 742B is elongated in the primary scanning direction x and arranged at a position closer to one of the ends which are spaced from each other in the secondary scanning direction y, as shown in FIGS. 18 and 21. The light guide receiving portion 742B is generally rectangular in cross section and opens downward in the thickness direction z.

The beam 711B corresponds to the first driven-side beam according to this variation of the invention and is elongated in the primary scanning direction x, as shown in FIG. 14. As shown in FIGS. 18 and 21, the beam 711B is adjacent to the light guide receiving portion 742B in the secondary scanning direction y. In this embodiment, the beam 711B includes a surface facing downward in the thickness direction z, and a pair of inclined surfaces inclined with respect to the secondary scanning direction y and the thickness direction z. The one of the paired inclined surfaces that is on the upper left side in the figure and a surface which faces this inclined surface are the paired supporting surfaces 721B. The supporting surfaces 721B correspond to the first driven-side supporting surfaces of this variation of the invention.

As shown in FIG. 14, the ribs 731B are arranged at equal intervals in the primary scanning direction x. As shown in FIG. 18, each of the ribs 731B is connected to the beam 711B, and in contact with the mirror 301B in this embodiment.

As shown in FIGS. 18 and 21, the lens unit receiving portion 743B is arranged adjacent to the center of the case 700B in the secondary scanning direction y.

The beam 712B corresponds to the second driven-side beam according to this variation of the invention and is elongated in the primary scanning direction x, as shown in FIG. 14. As shown in FIGS. 18 and 21, in the secondary scanning direction y, the beam 712B is on the opposite side of the beam 711B across the lens unit receiving portion 743B. In this embodiment, the beam 712B includes a surface facing downward in the thickness direction z, a surface facing to the right in the secondary scanning direction y, and an inclined surface inclined with respect to the secondary scanning direction y and the thickness direction z. Thus, the beam 712B is generally triangular in cross section. The inclined surface of the beam 712B and a surface facing the inclined surface are the paired supporting surfaces 722B. The supporting surfaces 722B correspond to the second driven-side supporting surfaces of this variation of the invention.

As shown in FIG. 14, the ribs 732B are arranged at equal intervals in the primary scanning direction x. As shown in FIG. 18, each of the ribs 732B is connected to the beam 712B, and in contact with the mirror 302B in this embodiment.

The substrate receiving portion 741B is elongated in the primary scanning direction x, and is open upward in the thickness direction z, as shown in FIGS. 18 and 21.

The outer beam 751B is an example of the driven-side outer beam of this variation of the invention and elongated in the primary scanning direction x, as shown in FIG. 14. As shown in FIGS. 18 and 21, the outer beam 751B is in the form of a wall standing in the thickness direction z. The connection ribs 742B constitute the driven-side connection portion of the variation of the invention and support the outer beam 751B. As shown in FIG. 14, the connection ribs 752B are spaded from each other in the primary scanning direction x. As shown in FIG. 18, the connection ribs 752B are connected to the lower end of the outer beam 751 in the thickness direction z and positioned at the lower end of the case 700B in the thickness direction z. The space surrounded by the outer beam 751B and adjacent ones of the connection ribs 752B is a driven roller receiving portion 753B. As shown in FIG. 14, the guide ribs 754B are spaced from each other in the primary scanning direction x. As shown in FIG. 18, the lower side of each guide rib 754B is made up of a plurality of curved surfaces.

The substrate 600B comprises an insulating member made of e.g. a ceramic material or a glass-fiber-reinforced epoxy resin, and a wiring pattern (not shown) formed on the insulating member. The substrate 600B is in the form of a rectangle elongated in the primary scanning direction x. The substrate 600B is housed in the substrate receiving portion 741B of the case 700B and fixed to the case 700 with e.g. an adhesive. As shown in FIGS. 18 and 21, on the substrate 600B is mounted the sensor IC 500B.

The light-transmitting plate 800B is a plate member made of a transparent material such as glass and attached to cover the lower side of the case 700B in the thickness direction z.

The light source unit 200B is a unit for emitting linear light necessary for image reading by the image sensor module 101B and includes an LED module 210B, a light guide 280B, and a reflector 285B.

Figure 31:
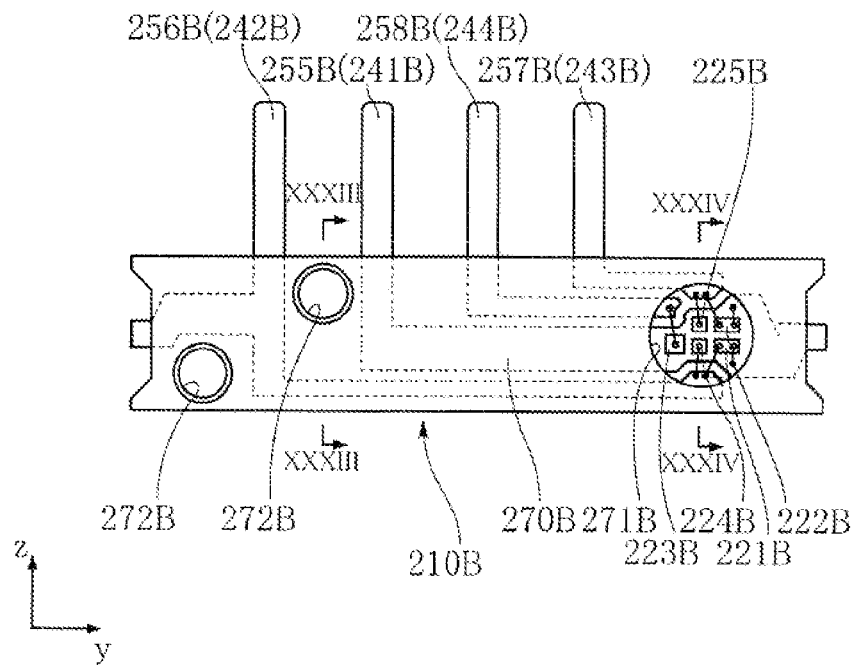
FIG. 31 is a front view showing an LED module of a light source unit of the driven-side image sensor module of the document scanner shown in FIG. 14.
Figure 32:
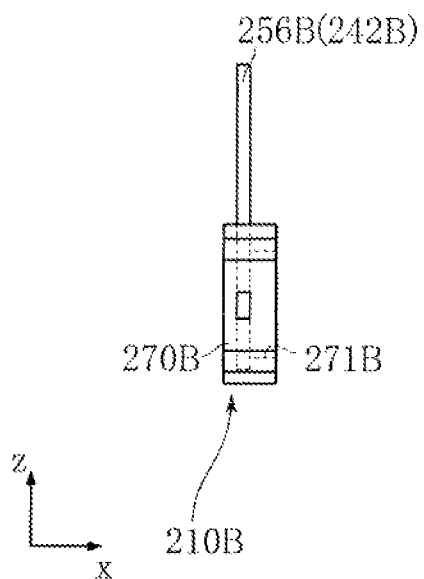
FIG. 32 is a side view showing the LED module of a light source unit of the driven-side image sensor module of the document scanner shown in FIG. 14.

The LED module 210B achieves the light emitting function of the light source unit 200B. As shown in FIGS. 31 and 32, the LED module 210B includes LED chips 221B, 222B, 223B, Zener diodes 224B, 225B, leads 241B, 242B, 243B, 244B and a resin package 270B.

The resin package 270B is made of a white resin such as liquid crystal polymer resin or an epoxy resin and covers part of each lead 241B, 242B, 243B, 244B. The resin package 270B includes an opening 271B and a plurality of positioning holes 272B. The opening 271B is provided adjacent to one of the ends of the resin package 270B which are spaced from each other in the secondary scanning direction y and is circular in cross section. The positioning holes 272B are provided at positions avoiding the leads 241B, 242B, 243B, 244B and penetrate the resin package 270B in this embodiment.

Figure 35:
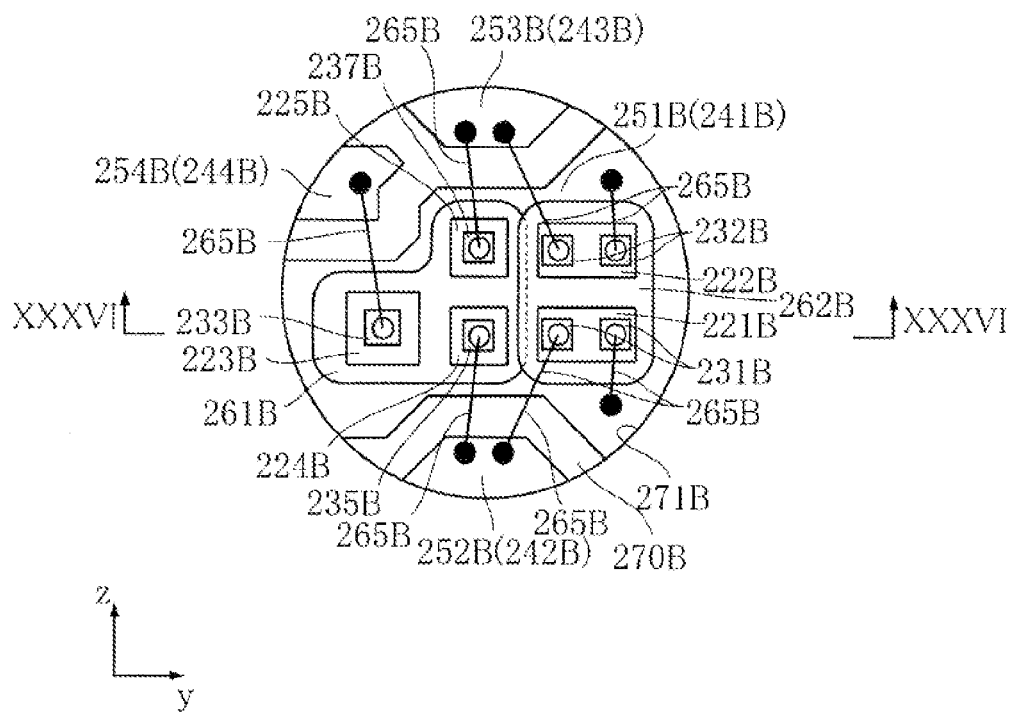
FIG. 35 is an enlarged front view schematically showing the opening of the LED module of FIG. 31.

As shown in FIGS. 31 and 35, the lead 241B includes a mount portion 251B and a terminal portion 255B. The lead 241B includes a portion elongated in the secondary scanning direction y and a portion elongated in the thickness direction z. The mount portion 251B is provided adjacent to the right end in the figure of the portion elongated in the secondary scanning direction y. On the mount portion 251B, the LED chips 221B, 222B, 223B and the Zener diodes 224B, 225B are mounted. In this embodiment, the mount portion 251B is partially narrowed in the thickness direction z as compared with adjacent portions of the lead 241B. The mount portion 251B is exposed through the opening 271B of the resin package 270B. The terminal portion 255B projects downward from the resin package 270B in the thickness direction z and is connected to the substrate 600B.

The lead 242B includes a wire bonding portion 252B and a terminal portion 256B. The lead 242B includes a portion elongated in the secondary scanning direction y and a portion elongated in the thickness direction z. The wire bonding portion 252B is provided adjacent to the right end in the figure of the portion elongated in the secondary scanning direction y. In this embodiment, the wire bonding portion 252B projects upward in the thickness direction z toward the mount portion 251B of the lead 241B. The wire bonding portion 252B is exposed through the opening 271E of the resin package 270B. The terminal portion 256B projects upward from the resin package 270B in the thickness direction z and is connected to the substrate 600B.

The lead 243B includes a wire bonding portion 253B and a terminal portion 257B. The lead 243B includes a portion extending in the secondary scanning direction y and a portion extending in the thickness direction z. The wire bonding portion 253B is provided adjacent to the right end in the figure of the portion elongated in the secondary scanning direction y. In this embodiment, the wire bonding portion 253B projects downward in the thickness direction z toward the mount portion 251B of the lead 241B. The wire bonding portion 253B is exposed through the opening 271B of the resin package 270B. The terminal portion 257B projects upward from the resin package 270B in the thickness direction z and is connected to the substrate 600B.

The lead 244B includes a wire bonding portion 259B and a terminal portion 258B. The lead 244B includes a portion elongated in the secondary scanning direction y and a portion elongated in the thickness direction z. The wire bonding portion 254B is provided adjacent to the right end in the figure of the portion elongated in the secondary scanning direction y. In this embodiment, the wire bonding portion 254B is positioned at the upper left in the figure of the mount portion 251B and on the left side in the figure of the wire bonding portion 253B. The wire bonding portion 254B is exposed through the opening 271B of the resin package 270B. The terminal portion 258B projects upward from the resin package 270B in the thickness direction z and is connected to the substrate 600B.

Figure 36:
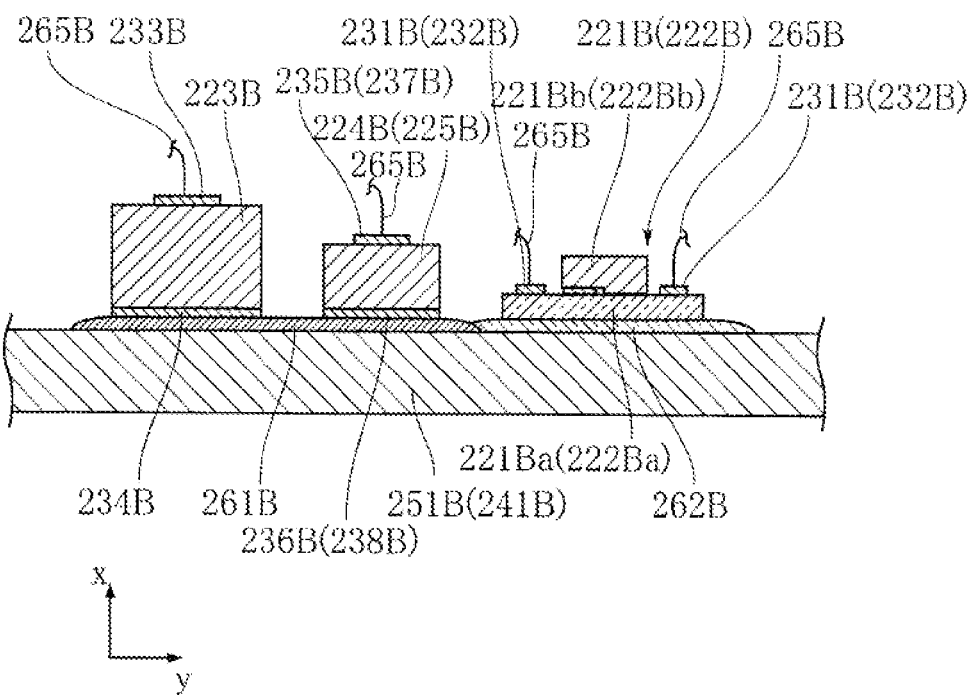
FIG. 36 is a schematic sectional view taken along lines XXXVI-XXXVI in FIG. 35.
Figure 37:
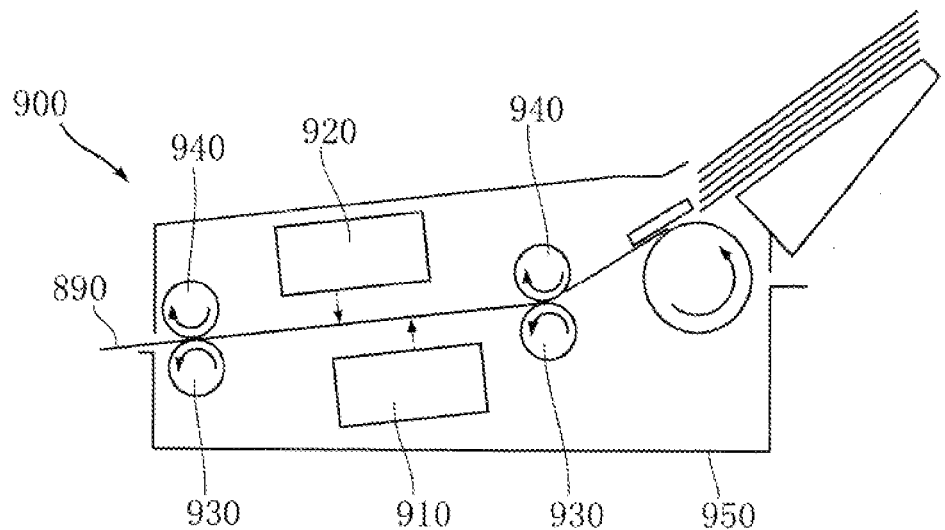
FIG. 37 is a sectional view showing an example of conventional document scanner.

In this embodiment, the LED chip 221B emits green light. As shown in FIGS. 35 and 36, the LED chip 221B includes a submount substrate 221Ba, a semiconductor layer 221Bb, and a pair of front electrodes 231B. The submount substrate 221Ba is made of e.g. Si and transparent. The semiconductor layer 221Bb is made of e.g. GaN-based semiconductor, and includes an n-type semiconductor layer, a p-type semiconductor layer and an active layer sandwiched between the n-type semiconductor layer and the p-type semiconductor layer (none shown). The front electrodes 231B are provided on the submount substrate 221Ba and electrically connected to the n-type semiconductor layer and the p-type semiconductor layer.

In this embodiment, the LED chip 222B emits blue light. For easier understanding, the references signs indicating the structural elements of the LED chip 222B corresponding to those of the LED chip 221B are shown in parentheses in FIG. 36. The LED chip 222B includes a submount substrate 222Ba, a semiconductor layer 222Bb, and a pair of front electrode 232B. The submount substrate 222Ba is made of e.g. Si and transparent. The semiconductor layer 222Bb is made of e.g. GaN-based semiconductor material, and includes an n-type semiconductor layer, a p-type semiconductor layer and an active layer sandwiched between the n-type semiconductor layer and the p-type semiconductor layer (none shown). The front electrodes 232B are provided on the submount substrate 222Ba and electrically connected to the n-type semiconductor layer and the p-type semiconductor layer.

In this embodiment, the LED chip 223B emits red light. As shown in FIGS. 35 and 36, the LED chip 223B includes a semiconductor layer made of e.g. GaAs-based semiconductor material, a front electrode 233B and a back electrode 234B. The semiconductor layer includes an n-type semiconductor layer, a p-type semiconductor layer and an active layer sandwiched between the n-type semiconductor layer and the p-type semiconductor layer (none shown). The front electrode 233B is provided on a side of the LED chip 223B which is opposite from the lead 241B. The back electrode 234B is provided on the lead 241B side of the LED chip 223B.

The Zener diode 224B serves to prevent excessive voltage application to the LED chip 221B. The Zener diode 224B includes a front electrode 235B and a back electrode 236B. The Zener diode 225B serves to prevent excessive voltage application to the LED chip 222B. The Zener diode 225B includes a front electrode 237B and a back electrode 238B.

The LED chips 221B and 222B are spaced from each other in the thickness direction z and mounted on the mount portion 251B of the lead 241B via an insulating layer 262B. In this embodiment, the insulating layer 262B is transparent and made of e.g. a transparent resin. The Zener diodes 224B and 225B are spaced from each other in the thickness direction z and positioned on the left side of the LED chips 221B and 222B in the secondary scanning direction y. The LED chip 223B is arranged on the opposite side of the LED chips 221B and 222B across the Zener diodes 224B and 225B in the secondary scanning direction y. The LED chip 223B and the Zener diodes 224B, 225B are mounted on the mount portion 251B of the lead 241B via a conductive layer 261B. Specifically, the back electrode 234B of the LED chip 223B and the back electrodes 236B, 238B of the Zener diodes 224B, 225B are electrically connected to the lead 241B via the conductive layer 261B. The conductive layer 261B is made of e.g. Ag.

The mounting process of the LED chips 221B, 222B, 223B and Zener diodes 224B, 225B is performed as follows. First, conductive paste as the material for the conductive layer 261B is applied to the mount portion 251B of the lead 241B. Then, the LED chip 223B and the Zener diodes 224B, 225B are bonded. Then, the conductive paste is hardened by e.g. baking, whereby the conductive layer 261B is obtained. Then, resin paste as the material for the insulating layer 262B is applied to the mount portion 251B. Then, the LED chips 221B and 222B are bonded. Then, the resin paste is hardened, whereby the insulating layer 262B is obtained.

In the above-described process, the insulating layer 262B is formed after the conductive layer 261B is formed. Thus, in the case where the application area of the conductive paste and the application area of the resin paste overlap each other, the conductive layer 261B intervenes between part of the insulating layer 262B and the mount portion 251B of the lead 241B. Shown in FIGS. 35 and 36 are the conductive layer 261B and the insulating layer 262B in this state. Depending on the application areas, the conductive layer 261B and the insulating layer 262B may not overlap each other. However, it is to be noted that, according to the above-described process, the insulating layer 262B never intervenes between the conductive layer 261B and the mount portion 251B of the lead 241B.

One of the paired front electrodes 231B of the LED chip 221B is connected to the mount portion 251B of the lead 241B with a wire 265B, whereas the other of the front electrodes 231B is connected to the wire bonding portion 252B of the lead 242B with a wire 265B. One of the paired front electrodes 232B of the LED chip 222B is connected to the mount portion 251B of the lead 241B with a wire 265B, whereas the other of the front electrodes 232B is connected to the wire bonding portion 253B of the lead 243B with a wire 265B.

The front electrode 233B of the LED chip 223B is connected to the wire bonding portion 254B of the lead 244B with a wire 265B. The front electrode 235B of the Zener diode 224B is connected to the wire bonding portion 252B of the lead 242B with a wire 265B. The front electrode 237B of the Zener diode 225B is connected to the wire bonding portion 253B of the lead 243B with a wire 265B.

The light guide 280B is provided for converting the light emitted from the LED module 210B into linear light elongated in the primary scanning direction x and made of a transparent acrylic resin such as PMMA (polymethyl methacrylate). The light guide 280B has a generally columnar shape elongated in the primary scanning direction x, and includes an incident surface 281B, a reflective surface 282B and an emission surface 283B, as shown in FIGS. 18, 21 and 34.

The incident surface 281B is one of the end surfaces of the light guide 280B which are spaced from each other in the primary scanning direction x. The incident surface 281B covers the opening 271B of the resin package 270B of the LED module 210B and faces the LED chips 221B, 222B and 223B. The reflective surface 282B is a surface elongated in the primary scanning direction x and formed at the upper right portion of the light guide 280B in FIGS. 18 and 21. The reflective surface 282B reflects the light traveling within the light guide 280B after entering through the incident surface 281B. For instance, the reflective surface 282B may be a surface with minute irregularities or a surface to which white paint is applied. The emission surface 283B is a surface elongated in the primary scanning direction x and arcuate in cross section in this embodiment. The light reflected at the reflective surface 282B is emitted from the emission surface 283B as linear light elongated in the primary scanning direction x.

Figure 33:
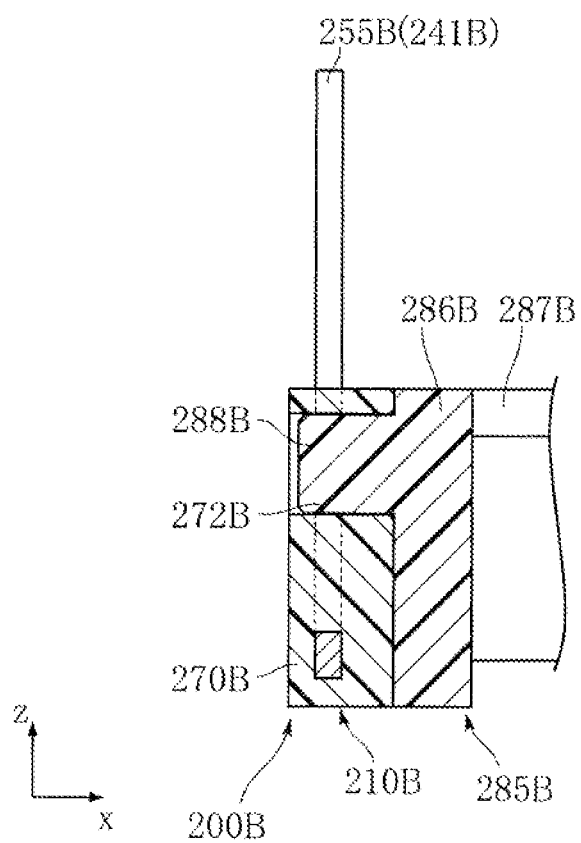
FIG. 33 is a schematic sectional view of the light source unit taken along lines XXXIII-XXXIII in FIG. 31.

The reflector 285B functions to position the light guide 280B relative to the LED module 210B and prevents unfavorable leaking of light from the light guide 280B. The reflector 285B is made of e.g. white resin. The reflector 285B includes a base portion 286B and a semicylindrical portion 287B. The base portion 286B is in the form of a rectangular plate similar in size and shape to the resin package 270B of the LED module 210B as viewed in the primary scanning direction x. The base portion 286B is provided with a plurality of projections 288B. As shown in FIG. 33, each of the projections 288B is fitted in a respective one of the positioning holes 272B of the resin package 270B of the LED module 210B. With this arrangement, the reflector 285B is positioned relative to the LED module 210B.

Figure 34:
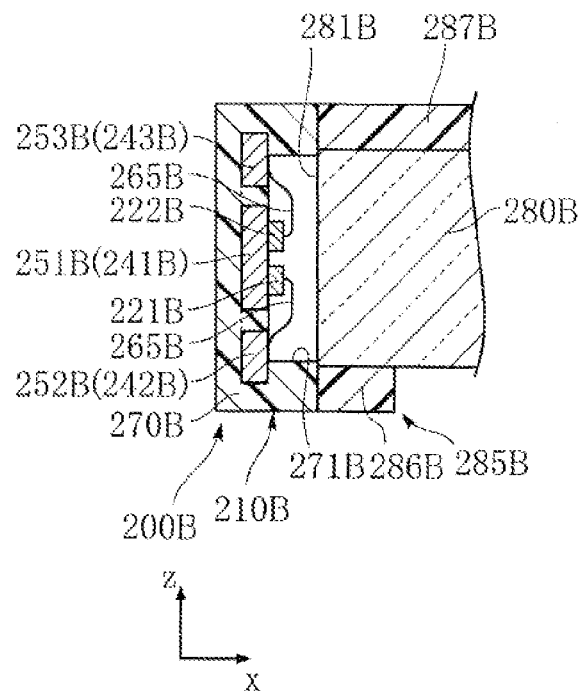
FIG. 34 is a schematic sectional view of the light source unit taken along lines XXXIV-XXXIV in FIG. 31.

The semicylindrical portion 287B is elongated in the primary scanning direction x, and holds in it the light guide 280B, as shown in FIGS. 18, 21 and 34. Of the semicylindrical portion 287B, the portion facing the reflective surface 282B of the light guide 280B functions to return the light exiting the light guide 280B through the reflective surface 282B into the light guide 280B. By holding the light guide 280B in the semicylindrical portion 287B, the light guide 280B is fixed to the reflector 285B. Accordingly, the light guide 280B is positioned relative to the LED module 210B, along with the reflector 285B.

As shown in FIG. 24, the LED chips 221B, 222B, 223B and the light guide 280B are arranged at a position deviated to the right from the terminal portions 255B, 256B, 257B, 258B in the secondary scanning direction y. The substrate 600B has a dimension in the secondary scanning direction y just enough for connection to the terminal portions 255B, 256B, 257B, 258B and does not have any extra space. The LED chips 221B, 222B, 223B and the light guide 280B are arranged at a position deviated to the right from the substrate 600B in the secondary scanning direction y. In this embodiment, the light guide 280B and the substrate 600B do not overlap at all in the secondary scanning direction y. However, this variation of the invention is not limited to this, and the light guide 280B and the substrate 600B may partially overlap in the secondary scanning direction y.

The mirror 301B corresponds to the first driven-side mirror of this variation of the invention. The mirror 301B is elongated in the primary scanning direction x. The mirror 301B has a reflective surface 311B and a pair of end surfaces 321B, as shown in FIGS. 18 and 21. The reflective surface 311B corresponds to the first driven-side reflective surface of this variation of the invention. The light emitted from the light source unit 200B and then reflected at the read object 890 is reflected at the reflective surface 311B in the secondary scanning direction y. In this embodiment, the reflective surface 311B is inclined 45° with respect to the secondary scanning direction y and the thickness direction z. The paired end surfaces 321B correspond to a pair of first driven-side end surfaces of the variation of the invention and are oriented in opposite directions, with the reflective surface 311B intervening between them. The end surfaces 321B are elongated in the primary scanning direction x and parallel to each other. The end surfaces 321B are in contact with the supporting surfaces 721B of the case 700B. The surface of the mirror 301B which is opposite to the reflective surface 311B is in contact with the ribs 731B.

The light traveling in the secondary scanning direction y after being reflected at the reflective surface 311B of the mirror 301B passes through the lens unit 400B. The lens unit 400B is made up of a plurality of rod lenses and a case made of e.g. resin and accommodating the rod lenses. The rod lenses are configured to form an erecting equal-magnification image of the content of the read object 890 onto the sensor IC 500B. The optical axis of the rod lenses extends in the secondary scanning direction y and perpendicularly to the primary scanning direction x. The lens unit 400B is housed in the lens unit receiving portion 743B of the case 700B.

The mirror 302B corresponds to the second driven-side mirror of this variation of the invention. The mirror 302B is elongated in the primary scanning direction x. The mirror 302B has a reflective surface 312B and a pair of end surfaces 322B. The reflective surface 312B corresponds to the second driven-side reflective surface of the variation of the invention. The light passing through the lens unit 400B is reflected at the reflective surface 312B in the thickness direction z. In this embodiment, the reflective surface 312B is inclined 45° with respect to the secondary scanning direction y and the thickness direction z. The paired end surfaces 322B correspond to a pair of second driven-side end surfaces of the variation of the invention and are oriented in opposite directions, with the reflective surface 312B intervening between them. The end surfaces 322B are elongated in the primary scanning direction x and parallel to each other. The end surfaces 322B are in contact with the supporting surfaces 722B of the case 700B. The surface of the mirror 302B which is opposite to the reflective surface 312B is in contact with the ribs 732B.

The optical axis of the lens unit 400B, which extends in the secondary scanning direction y, crosses the reflective surfaces 311B, 312B of the mirrors 301B, 302B. The crossing point of the optical axis of the lens unit 400B and the reflective surface 311B of the mirror 301B is positioned lower than the center of the reflective surface 311B in the thickness direction z. The crossing point of the optical axis of the lens unit 400B and the reflective surface 312B of the mirror 302B is positioned lower than the center of the reflective surface 312B in the thickness direction z.

The case 700B is made by using a resin material such that the mirrors 301B, 302B become integral with the case. As shown in FIG. 21, at positions along the primary scanning direction x where the ribs 731B, 732B are not provided, the reflective surface 311B and the opposite surface of the mirror 301B, as well as the reflective surface 312B and the opposite surface of the mirror 302B are exposed in the thickness direction z. To make the case 700B, the mirrors 301B and 302B are held by a jig from above and below in the thickness direction z. After the mirrors 301B and 302B, along with the jig, are placed in a mold, a resin material is injected into the mold and then hardened. By this process, the case 700B integrally formed with the mirrors 301B, 302B is obtained.

The sensor IC 500B is an element having a photoelectric conversion function to convert received light into electric signals, and mounted on the substrate 600B, as shown in FIGS. 18 and 21. The sensor IC 500B includes a plurality of light-receiving surfaces (not shown) arranged in a row extending in the primary scanning direction x. The light reflected at the read object 890 is converged by the lens unit 400B onto the light receiving surfaces. The sensor IC 500B is a driven-side sensor IC of the variation of the invention.

As shown in FIGS. 18, 21 and 24, the light-transmitting plate 800B is provided with a light-shielding film 810B. The light-shielding film 810B is an example of the driven-side light shield of the variation of the invention and formed by applying black paint or attaching a black resin tape to part of the upper surface of the light-transmitting plate 800B. The light-shielding film 810B is elongated in the primary scanning direction x, and overlaps the entirety of the mirror 302B and the left end of the lens unit 400B in the secondary scanning direction y. The driven-side light shield of the variation of the invention is not limited to the light-shielding film 810B. For instance, the driven-side light shield may comprise part of the case 700B.

As shown in FIGS. 14, 15 and 19, the paired driving rollers 781A are spaced from each other in the secondary scanning direction y and extend in parallel to each other on each side of the image sensor module 101A. Each of the driving rollers 781A is connected to a driving source such as a motor, not shown. By the driving force from the driving source, the driving rollers 781A transfer the read object 890 from left to right in the secondary scanning direction y.

In this embodiment, as shown in FIGS. 14 and 15, of the paired driving rollers 781A, the one on the left side in the figures in the secondary scanning direction y (upstream in the transfer direction of the read object 890) is included in a driving roller unit 780A separate from the image sensor module 101A. The driving roller unit 780A comprises the driving roller 781A and a case 782A housing the driving roller 781A. The case 782A is arranged adjacent to the image sensor module 101A. The other of the paired driving rollers 781A, which is on the right side in the secondary scanning direction y (downstream in the transfer direction of the read object 890), is housed in a driving roller receiving portion 753A formed in the case 700A of the image sensor module 101A. As shown in FIG. 14, the shafts of the driving rollers 781A extend in the primary scanning direction x and connected to a driving source such as a motor, not shown.

The paired driven rollers 781B are spaced from each other in the secondary scanning direction y and extend in parallel to each other on each side of the image sensor module 101B. Each of the driven rollers 781B is arranged to face a respective one of the driving rollers 781A. The read object 890 is sandwiched between and transferred by the facing pairs of driving rollers 781A and driven rollers 781B. In this embodiment, each of the driven rollers 781B comprises a plurality of smaller rollers aligned in the primary scanning direction x.

As shown in FIGS. 15 and 19, of the paired driven rollers 781B, the one on the left side in the figures in the secondary scanning direction y (upstream in the transfer direction of the read object 890) is housed in a driven roller receiving portion 753B of the image sensor module 101B. As clearly shown in FIG. 14, the smaller rollers constituting this driven roller 781B are arranged at positions avoiding the connection ribs 752B in the primary scanning direction x. The other of the paired driven rollers 781B, which is on the right side in the secondary scanning direction y, (downstream in the transfer direction of the read object 890), is arranged adjacent to the case 700B of the image sensor module 101B. As shown in FIG. 14, the smaller rollers constituting this driven roller 781B are arranged at positions avoiding the guide ribs 754B in the primary scanning direction x. The driven roller 781B may be fixed to the case 700B via a bracket, not shown. For instance, the bracket may be provided with a biasing means such as a spring for pressing the driven roller 781B against the driving roller 781A in the thickness direction z. When the paired driven rollers 781B are fixed to the image sensor module 101B, the movable case 120B does not need to have a portion for fixing the driven rollers 781B.

The advantages of the document scanner 110 are described below.

According to this embodiment, in the image sensor module 101A, the outer beam 751A and the connection portion 752A function to protect the driving roller 781A and enhance the mechanical strength of the case 700A. Since the driving roller 781A is protected by the outer beam 751A and the connection portion 752A, the stationary case 120A does not need to have a portion for protecting the driving roller 781A. Further, since the mechanical strength of the case 700A is enhanced by the existence of the outer beam 751A and the connection portion 752A, the portion of the case 700A on the side of the driving roller 781A can be made relatively thin. This allows the image sensor module 101A and the driving roller 781A to be arranged close to each other, without reducing the mechanical strength of the case 700A. In the image sensor module 101B, the outer beam 751B and the connection ribs 752B function to protect the driven roller 781B and enhance the mechanical strength of the case 700B. Since the driven roller 781B is protected by the outer beam 751B and the connection ribs 752B, the stationary case 120B does not need to have a portion for protecting the driven roller 781B. Further, since the mechanical strength of the case 700B is enhanced by the existence of the outer beam 751B and the connection ribs 752B, the portion of the case 700B on the side of the driven roller 781B can be made relatively thin. This allows the image sensor module 101B and the driven roller 781B to be arranged close to each other, without reducing the mechanical strength of the case 700B. Thus, size reduction of the document scanner 110 is realized.

As shown in FIG. 17, the portion of the case 700A where the light guide receiving portion 742A is formed has a generally U-shaped cross section extending in the primary scanning direction x and has a relatively high mechanical strength. On the other hand, the mechanical strength of the portion of the case where the mirror 302A is attached is enhanced by the existence of the outer beam 751A and the connection portion 752A constituting the driving roller receiving portion 753A. Thus, the case 700A has a balanced strength on each side in the secondary scanning direction y.

In this embodiment, as shown in FIGS. 17 and 20, the light path extending from the read object 890 is bent before reaching the sensor IC 500A and is parallel to the secondary scanning direction y in passing through the lens unit 400A. With this arrangement, the light path can be made relatively long without increasing the dimension of the image sensor module 101A in the thickness direction z. Since the mirrors 301A, 302A are formed integrally on the case 700A, the mechanical strength of the case 700A is enhanced by the mirrors 301A, 302A. Thus, the image sensor module 101A can be reduced in dimension in the thickness direction z without reducing the mechanical strength of the case 700A. Likewise, as shown in FIGS. 18 and 21, the image sensor module 101B can be reduced in dimension in the thickness direction z without reducing the mechanical strength of the case 700B. Thus, thickness reduction of the document scanner 110 is realized.

In the image sensor module 101A, the mirror 301A is reliably fixed to the case 700A by holding the paired end surfaces 321A of the mirror 301A by the paired supporting surfaces 721A of the case 700A. Similarly, the mirror 302A is reliably fixed to the case 700A by holding the paired end surfaces 322A of the mirror 302A between the paired supporting surfaces 722A of the case 700A. Since the beams 711A and 712A are elongated in the primary scanning direction x, the mirrors 301A and 302A are held throughout the entire length. The ribs 731A and 732A prevent the beams 711A and 712A from being unfavorably warped. Since the ribs 731A, 732A are spaced from each other in the primary scanning direction x, in molding the case 700A, the mirrors 301A and 302A can be properly fixed at positions where the ribs 731A, 732A are not provided, as shown in FIG. 20. These advantages hold true for the image sensor module 101B.

As noted before, in the image sensor module 101A, the crossing point of the optical axis of the lens unit 400A and the reflective surface 311A, 312A of the mirror 301A, 302A is positioned higher than the center of the reflective surface 311A, 312A in the thickness direction z. That is to say, the lens unit 400A is arranged at a relatively high position in the thickness direction z relative to the mirrors 301A, 302A. With this arrangement, large space for the sensor IC 500A is secured below the mirror 302A and the lens unit 400A in the thickness direction z. Generally, connection between the sensor IC 500A and the substrate 600A requires a plurality of wires. The large space is helpful to prevent unfavorable contact between the wires and the case 700A. The lens unit 400A is arranged at a relatively high position in the thickness direction z, while the mirrors 301A and 302A are arranged adjacent to the center of the case 700A in the thickness direction z. The mirrors 301A and 302A serve to increase the mechanical strength of the case 700A, and arrangement of the mirrors 301A and 302A closer to the center of the case 700A is more favorable for the enhancement of the mechanical strength of the case 700A. These advantages hold true for the image sensor module 101B.

In the image sensor module 101A, the arrangement of the light guide 280A, the mirror 301A, the lens unit 400A, and the mirror 302A side by side in the secondary scanning direction y is favorable for thickness reduction of the image sensor module 101A. As noted before, the width of the substrate 600A is set such that the substrate does not overlap the light guide 280A or the LED chips 221A, 222A, 223A in the secondary scanning direction y. Such a substrate 600A, which is not unnecessarily large, contributes to cost reduction. These advantages hold true for the image sensor module 101B.

The document scanner according to this variation of the invention is not limited to the foregoing embodiment. The specific structure of each part of the document scanner according to the present invention may be varied in design in many ways.

Variations of the present invention are described below as appendixes.

APPENDIX 1

A document scanner comprising:
a pair of driving rollers arranged on a first side of a read object in a thickness direction, including respective rotation axes extending in a primary scanning direction, and spaced from each other in a secondary scanning direction;
a pair of driven rollers arranged on a second side opposite to the first side of the read object in the thickness direction, including respective rotation axes extending in the primary scanning direction, and spaced from each other in the secondary scanning direction such that each of the driven rollers faces a respective one of the driving rollers;
a driving-side image sensor module arranged on the first side of the read object in the thickness direction, comprising:
    a driving-side light source unit for emitting linear light elongated in the primary scanning direction;
    a driving-side lens unit for allowing light reflected by the read object to pass therethrough;
    a driving-side sensor IC for receiving light passing through the driving-side lens unit; and
    a driving-side case accommodating the driving-side light source unit, the driving-side lens unit and the driving-side sensor IC;
the driving-side light source unit, the driving-side lens unit and the driving-side sensor IC being arranged between the paired driving rollers in the secondary scanning direction,
the driving-side case including a driving-side outer beam positioned outwardly from one of the driving rollers in the secondary scanning direction and elongated in the primary scanning direction, and a driving-side connection portion supporting the driving-side outer beam; and a driven-side image sensor module arranged on the second side of the read object in the thickness direction, comprising:

a driven-side light source unit for emitting linear light elongated in the primary scanning direction;

a driven-side lens unit for allowing light reflected by the read object to pass therethrough;

a driven-side sensor IC for receiving light passing through the driven-side lens unit; and a driven-side case accommodating the driven-side light source unit, the driven-side lens unit and the driven-side sensor IC;

the driven-side light source unit, the driven-side lens unit and the driven-side sensor IC being arranged between the paired driven rollers in the secondary scanning direction, the driven-side case including a driven-side outer beam positioned outwardly from one of the driven rollers in the secondary scanning direction and elongated in the primary scanning direction, and a driven-side connection portion supporting the driven-side outer beam.

APPENDIX 2

The document scanner as set forth in Appendix 1, wherein the driving-side image sensor module includes:

a first driving-side mirror including a pair of first driving-side end surfaces elongated in the primary scanning direction and a first driving-side reflective surface sandwiched between the first driving-side end surfaces, the first driving-side mirror being configured to reflect the linear light, having been reflected by the read object, at the first driving-side reflective surface in the secondary scanning direction; and a second driving-side mirror including a pair of second driving-side end surfaces elongated in the primary scanning direction and a second driving-side reflective surface sandwiched between the second driving-side end surfaces, the second driving-side mirror being configured to reflect light, having traveled in the secondary scanning direction, at the second driving-side reflective surface in the thickness direction, the driving-side lens unit being configured to allow light traveling from the first driving-side mirror to the second driving-side mirror to pass therethrough, the driving-side case being integrally formed with the first and the second driving-side mirrors and including a pair of first driving-side supporting surfaces in contact with the first driving-side end surfaces and a pair of second driving-side supporting surfaces in contact with the second driving-side end surfaces.

APPENDIX 3

The document scanner as set forth in Appendix 2, wherein the driving-side outer beam and the driving-side connection portion are positioned opposite to the driving-side lens unit across the second driving-side mirror in the secondary scanning direction.

APPENDIX 4

The document scanner as set forth in Appendix 3, wherein, in the thickness direction, the driving-side connection portion is farther from the read object than the driving rollers are.

APPENDIX 5

The document scanner as set forth in Appendix 4, wherein the driving-side connection portion is continuous in the primary scanning direction.

APPENDIX 6

The document scanner as set forth in any one of Appendixes 2 through 5, wherein the driving-side case is elongated in the primary scanning direction and includes a first driving-side beam, and one of the first driving-side supporting surfaces comprises a surface of the first driving-side beam.

APPENDIX 7

The document scanner as set forth in Appendix 6, wherein the driving-side case includes a plurality of first driving-side ribs connected to the first driving-side beam and spaced from each other in the primary scanning direction.

APPENDIX 8

The document scanner as set forth in any one of Appendixes 2 through 7, wherein the driving-side case is elongated in the primary scanning direction and includes a second driving-side beam, and one of the second driving-side supporting surfaces comprises a surface of the second driving-side beam.

APPENDIX 9

The document scanner as set forth in Appendix 8, wherein the driving-side case includes a plurality of second driving-side ribs connected to the second driving-side beam and spaced from each other in the primary scanning direction.

APPENDIX 10

The document scanner as set forth in any one of Appendixes 2 through 9, wherein an optical axis of the driving-side lens unit crosses the first driving-side mirror at a point offset from the center of the first driving-side mirror in the thickness direction toward the read object.

APPENDIX 11

The document scanner as set forth in any one of Appendixes 2 through 10, wherein the optical axis of the driving-side lens unit crosses the second driving-side mirror at a point offset from the center of the second driving-side mirror in the thickness direction toward the read object.

APPENDIX 12

The document scanner as set forth in any one of Appendixes 2 through 11, wherein the driving-side light source unit, the first driving-side mirror, the driving-side lens unit and the second driving-side mirror overlap each other in the thickness direction.

APPENDIX 13

The document scanner as set forth in any one of Appendixes 2 through 12, further comprising a driving-side light shield arranged opposite to the driving-side sensor IC across the second driving-side mirror in the thickness direction and overlapping the second driving-side mirror and the driving-side lens unit in the secondary scanning direction.

APPENDIX 14

The document scanner as set forth in Appendix 13, further comprising a driving-side light-transmitting plate arranged closer to the read object in the thickness direction than the driving-side light source unit, the first driving-side mirror, the driving-side lens unit and the second driving-side mirror are;
wherein the driving-side light shield comprises a light-shielding film formed on the driving-side light-transmitting plate.

APPENDIX 15

The document scanner as set forth in any one of Appendixes 1 through 14, wherein the driven-side image sensor module includes:
a first driven-side mirror including a pair of first driven-side end surfaces elongated in the primary scanning direction and a first driven-side reflective surface sandwiched between the first driven-side end surfaces, the first driven-side mirror being configured to reflect the linear light, having been reflected by the read object, at the first driven-side reflective surface in the secondary scanning direction; and
a second driven-side mirror including a pair of second driven-side end surfaces elongated in the primary scanning direction and a second driven-side reflective surface sandwiched between the second driven-side end surfaces, the second driven-side mirror being configured to reflect light, having traveled in the secondary scanning direction, at the second driven-side reflective surface in the thickness direction;
the driven-side lens unit being configured to allow light traveling from the first driven-side mirror to the second driven-side mirror to pass therethrough,
the driven-side case being integrally formed with the first and the second driven-side mirrors and including a pair of first driven-side supporting surfaces in contact with the first driven-side end surfaces and a pair of second driven-side supporting surfaces in contact with the second driven-side end surfaces.

APPENDIX 16

The document scanner as set forth in Appendix 15, wherein the driven-side outer beam and the driven-side connection portion are positioned opposite to the driven-side lens unit across the second driven-side mirror in the secondary scanning direction.

APPENDIX 17

The document scanner as set forth in Appendix 16, wherein, in the thickness direction, the driven-side connection portion is closer to the read object than a rotational center of the driven rollers are.

APPENDIX 18

The document scanner as set forth in Appendix 17, wherein the driven-side connection portion comprises a plurality of ribs spaced from each other in the primary scanning direction.

APPENDIX 19

The document scanner as set forth in any one of Appendixes 15-18, wherein the driven-side case is elongated in the primary scanning direction and includes a first driven-side beam, and one of the first driven-side supporting surfaces comprises a surface of the first driven-side beam.

APPENDIX 20

The document scanner as set forth in Appendix 19, wherein the driven-side case includes a plurality of first driven-side ribs connected to the first driven-side beam and spaced from each other in the primary scanning direction.

APPENDIX 21

The document scanner as set forth in any one of Appendixes 15 through 20, wherein the driven-side case is elongated in the primary scanning direction and includes a second driven-side beam, and one of the second driven-side supporting surfaces comprises a surface of the second driven-side beam.

APPENDIX 22

The document scanner as set forth in Appendix 21, wherein the driven-side case includes a plurality of second driven-side ribs connected to the second driven-side beam and spaced from each other in the primary scanning direction.

APPENDIX 23

The document scanner as set forth in any one of Appendixes 15 through 22, wherein an optical axis of the driven-side lens unit crosses the first driven-side mirror at a point offset from the center of the first driven-side mirror in the thickness direction toward the read object.

APPENDIX 24

The document scanner as set forth in any one of Appendixes 15 through 23, wherein the optical axis of the driven-side lens unit crosses the second driven-side mirror at a point offset from the center of the second driven-side mirror in the thickness direction toward the read object.

APPENDIX 25

The document scanner as set forth in any one of Appendixes 15 through 24, wherein the driven-side light source unit, the first driven-side mirror, the driven-side lens unit and the second driven-side mirror overlap each other in the thickness direction.

APPENDIX 26

The document scanner as set forth in any one of Appendixes 15 through 25, further comprising a driven-side light shield arranged opposite to the driven-side sensor IC across the second driven-side mirror in the thickness direction and overlapping the second driven-side mirror and the driven-side lens unit in the secondary scanning direction.

APPENDIX 27

The document scanner as set forth in Appendix 26, further comprising a driven-side light-transmitting plate arranged closer to the read object in the thickness direction than the driven-side light source unit, the first driven-side mirror, the driven-side lens unit and the second driven-side mirror are;

wherein the driven-side light shield comprises a light-shielding film formed on the driven-side light-transmitting plate.

The invention claimed is:
1. An LED module comprising:
a first LED chip and a second LED chip each including a pair of front electrodes provided on a same side;
a third LED chip including a front electrode and a back electrode provided on opposite sides;
a first and a second Zener diodes for preventing excessive voltage application to the first and the second LED chips;
a first lead including a mount portion on which the first through the third LED chips and the first and the second Zener diodes are mounted;
a resin package covering part of the first lead and including an opening that exposes the first through the third LED chips and the first and the second Zener diodes;
a common insulating layer that bonds the first and the second LED chips to the first lead; and
a common conductive layer that bonds the third LED chip and the first and the second Zener diodes to the first lead;
wherein the first and the second Zener diodes are arranged between the first, the second LED chips and the third LED chip.

2. The LED module according to claim 1, wherein the conductive layer contains Ag.

3. The LED module according to claim 1, wherein the insulating layer is transparent.

4. The LED module according to claim 1, wherein part of the conductive layer intervenes between the mount portion and part of the insulating layer.

5. The LED module according to claim 1, wherein the conductive layer and the insulating layer are arranged side by side in a second direction perpendicular to a first direction normal to a surface of the mount portion on which the first through the third LED chips and the first and the second Zener diodes are mounted.

6. The LED module according to claim 5, wherein the first LED chip and the second LED chip are arranged side by side in a third direction perpendicular to both of the first direction and the second direction.

7. The LED module according to claim 6, wherein the first Zener diode and the second Zener diode are arranged side by side in the third direction.

8. The LED module according to claim 1, further comprising: a second lead including a wire bonding portion arranged on a first side in the third direction with respect to the mount portion of the first lead; and a third lead including a wire bonding portion arranged on a second side opposite to the first side in the third direction with respect to the mount portion of the first lead:
wherein the first LED chip is arranged on the first side in the third direction with respect to the second LED chip, with one of the paired front electrodes thereof connected to the wire bonding portion of the second lead via a wire, and
the second LED chip is arranged on the second side in the third direction with respect to the first LED chip, with one of the paired front electrodes thereof connected to the wire bonding portion of the third lead via a wire.

9. The LED module according to claim 8, wherein the other one of the paired front electrodes of each of the first LED chip and the second LED chip is connected to the first lead via a wire.

10. The LED module according to claim 9, wherein: the first Zener diode includes a front electrode connected to the wire bonding portion of the second lead via a wire, and
the second Zener diode includes a front electrode connected to the wire bonding portion of the third lead via a wire.

11. The LED module according to claim 8, wherein the wire bonding portion of the second lead projects toward the mount portion of the first lead in the third direction.

12. The LED module according to claim 8, wherein the wire bonding portion of the third lead projects toward the mount portion of the first lead in the third direction.

13. The LED module according to claim 8, wherein each of the first through the third leads includes a terminal portion extending out the resin package in the third direction from a position deviated from the opening in the second direction.

14. An image sensor module comprising:
a light source unit including the LED module as set forth in claim 13 and a light guide, the light guide being elongated in a primary scanning direction corresponding to the first direction and including an incident surface facing the opening, a reflective surface for reflecting light traveling from the incident surface, and an emission surface for emitting light traveling from the reflective surface as linear light elongated in the primary scanning direction;
a first mirror including a pair of first end surfaces elongated in the primary scanning direction and a first reflective surface sandwiched between the first end surfaces, the first mirror being configured to reflect the linear light, having been reflected by the read object, at the first reflective surface in a secondary scanning direction corresponding to the second direction;
a lens unit for allowing light reflected by the first mirror to pass therethrough;
a second mirror including a pair of second end surfaces elongated in the primary scanning direction and a second reflective surface sandwiched between the second end surfaces, the second mirror being configured to reflect light passing through the lens unit at the second reflective surface in a thickness direction perpendicular to both of the primary scanning direction and the secondary scanning direction;
a case integrally formed with the first and the second mirrors;
a sensor IC for receiving light reflected by the second mirror; and
a substrate on which the sensor IC is mounted and to which the terminal portions of the first through the third leads of the LED module are connected.

15. The image sensor module according to claim 14, wherein the substrate and at least part of the light guide are arranged so as not to overlap each other in the secondary scanning direction.

16. The image sensor module according to claim 14, wherein the case includes a pair of first supporting surfaces in contact with the first end surfaces and a pair of second supporting surfaces in contact with the second end surfaces.

17. The image sensor module according to claim 14, wherein an optical axis of the lens unit crosses the first mirror at a point offset toward the read object in the thickness direction of the first mirror.

18. The image sensor module according to claim 17, wherein the optical axis of the lens unit crosses the second mirror at a point offset toward the read object in the thickness direction of the second mirror.

19. The image sensor module according to claim 14, wherein the light guide, the first mirror, the lens unit and the second mirror are arranged side by side in a mentioned order in the secondary scanning direction and overlap each other in the thickness direction.

\* \* \* \* \*